(12) United States Patent
Luo

(10) Patent No.: US 11,251,403 B2
(45) Date of Patent: Feb. 15, 2022

(54) DISPLAY SUBSTRATE, DISPLAY APPARATUS, AND METHOD OF FABRICATING DISPLAY SUBSTRATE

(71) Applicant: BOE Technology Group Co., Ltd., Beijing (CN)

(72) Inventor: Chengyuan Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 552 days.

(21) Appl. No.: 16/332,499

(22) PCT Filed: Apr. 28, 2018

(86) PCT No.: PCT/CN2018/085061
§ 371 (c)(1),
(2) Date: Mar. 12, 2019

(87) PCT Pub. No.: WO2019/205127
PCT Pub. Date: Oct. 31, 2019

(65) Prior Publication Data
US 2021/0384471 A1    Dec. 9, 2021

(51) Int. Cl.
*H01L 51/52*    (2006.01)
*H01L 27/142*   (2014.01)
*H01L 51/56*    (2006.01)

(52) U.S. Cl.
CPC ........ *H01L 51/5256* (2013.01); *H01L 27/142* (2013.01); *H01L 51/56* (2013.01)

(58) Field of Classification Search
CPC ............. H01L 27/3258; H01L 51/5253; H01L 27/3262; H01L 27/3265; H01L 27/3272; H01L 27/3276
See application file for complete search history.

(56) References Cited

U.S. PATENT DOCUMENTS

2016/0370611 A1   12/2016   Jiang et al.
2017/0345881 A1   11/2017   Kim et al.
(Continued)

FOREIGN PATENT DOCUMENTS

CN    104880864 A    9/2015
CN    106450029 A    2/2017
(Continued)

OTHER PUBLICATIONS

First Office Action in the Korean Patent Application No. 20207016684, dated Feb. 28, 2021; English translation attached.
(Continued)

*Primary Examiner* — Dung A. Le
(74) *Attorney, Agent, or Firm* — Intellectual Valley Law, P.C.

(57) ABSTRACT

The present application provides display substrate having a display area and a peripheral area. The display substrate includes a base substrate; a plurality of light emitting elements on the base substrate and in the display area; an encapsulating layer on a side of the plurality of light emitting elements distal to the base substrate to encapsulate the plurality of light emitting elements; and a first barrier layer on the base substrate and in the peripheral area and forming a first enclosure substantially surrounding a first area. The first barrier layer includes an up-conversion material configured to convert an incident light into an ultraviolet light. The encapsulating layer includes a first organic encapsulating sub-layer on the base substrate.

20 Claims, 16 Drawing Sheets

(56) References Cited

U.S. PATENT DOCUMENTS

| | | | |
|---|---|---|---|
| 2018/0053810 A1* | 2/2018 | Jin | G06F 3/04164 |
| 2018/0138450 A1* | 5/2018 | Park | H01L 27/3246 |
| 2018/0233541 A1* | 8/2018 | Zeng | H01L 27/323 |
| 2019/0221775 A1 | 7/2019 | Wang | |

FOREIGN PATENT DOCUMENTS

| | | |
|---|---|---|
| CN | 107104202 A | 8/2017 |
| CN | 107689424 A | 2/2018 |
| KR | 20160000853 A | 1/2016 |
| KR | 20160140074 A | 12/2016 |
| KR | 20170062856 A | 6/2017 |
| KR | 20170134828 A | 12/2017 |

OTHER PUBLICATIONS

First Office Action in the Indian Patent Application No. 201937033666, dated Feb. 10, 2021; English translation attached.
International Search Report & Written Opinion dated Jan. 30, 2019, regarding PCT/CN2018/085061.

* cited by examiner

DISPLAY SUBSTRATE, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2018/085061, filed Apr. 28, 2018, the contents of which are incorporated by reference in the entirety.

TECHNICAL FIELD

The present invention relates to display technology, more particularly, to a display substrate having a display area and a peripheral area, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD. An OLED display apparatus typically includes an anode, an organic layer including a light emitting layer, and a cathode. OLEDs can be either a bottom-emission type OLED or a top-emission type OLED.

SUMMARY

In one aspect, the present invention provides a display substrate having a display area and a peripheral area, comprising a base substrate; a plurality of light emitting elements on the base substrate and in the display area; an encapsulating layer on a side of the plurality of light emitting elements distal to the base substrate to encapsulate the plurality of light emitting elements; and a first barrier layer on the base substrate and in the peripheral area and forming a first enclosure substantially surrounding a first area; wherein the first barrier layer comprises an up-conversion material configured to convert an incident light into an ultraviolet light; and wherein the encapsulating layer comprises a first organic encapsulating sub-layer on the base substrate.

Optionally, the display substrate further comprises a first inorganic encapsulating sub-layer encapsulating the plurality of light emitting elements and the first barrier layer; wherein the first organic encapsulating sub-layer is substantially enclosed inside the first area and is on a side of the first inorganic encapsulating sub-layer distal to the base substrate.

Optionally, the display substrate further comprises a second barrier layer on the base substrate and in the peripheral area and forming a second enclosure substantially surrounding a second area, the second area being larger than the first area; wherein the first inorganic encapsulating sub-layer encapsulates the plurality of light emitting elements, the first barrier layer, and the second barrier layer; and the first inorganic encapsulating sub-layer is in contact with the base substrate in an area between the first barrier layer and the second barrier layer.

Optionally, the first organic encapsulating sub-layer is substantially enclosed inside the second area.

Optionally, the second barrier layer comprises the up-conversion material configured to convert the incident light into the ultraviolet light.

Optionally, the second barrier layer has a height relative to the base substrate greater than a height relative to the base substrate of the first barrier layer.

Optionally, the first barrier layer and the second barrier layer are spaced apart from each other by a distance in a range of approximately 0.5 mm to approximately 2 mm; and each of the first barrier layer and the second barrier layer has a lateral thickness in a range of approximately 10 μm to approximately 20 μm.

Optionally, the encapsulating layer further comprises a second inorganic encapsulating sub-layer on a side of the first organic encapsulating sub-layer distal to the base substrate, encapsulating the plurality of light emitting elements, the first barrier layer, the second barrier layer, the first inorganic encapsulating sub-layer, and the first organic encapsulating sub-layer.

Optionally, the encapsulating layer further comprises a second organic encapsulating sub-layer on a side of the second inorganic encapsulating sub-layer distal to the base substrate, and substantially enclosed inside the second area.

Optionally, the encapsulating layer further comprises a third inorganic encapsulating sub-layer on a side of the second organic encapsulating sub-layer distal to the base substrate.

Optionally, the display substrate further comprises a third barrier layer on the base substrate and in the peripheral area and forming a third enclosure substantially surrounding a third area, the third area being larger than the second area; wherein the first inorganic encapsulating sub-layer is on a side of the first barrier layer, the second barrier layer, and the third barrier layer distal to the base substrate, encapsulating the plurality of light emitting elements, the first barrier layer, the second barrier layer, and the third barrier layer; the first inorganic encapsulating sub-layer is in contact with the base substrate in an area between the second barrier layer and the third barrier layer, and the second inorganic encapsulating sub-layer is on a side of the first inorganic encapsulating sub-layer and the first organic encapsulating sub-layer distal to the base substrate, encapsulating the plurality of light emitting elements, the first barrier layer, the second barrier layer, the third barrier layer, the first inorganic encapsulating sub-layer, and the first organic encapsulating sub-layer.

Optionally, the encapsulating layer further comprises a second organic encapsulating sub-layer on a side of the second inorganic encapsulating sub-layer distal to the base substrate, and substantially enclosed inside the third area.

Optionally, the third barrier layer comprises the up-conversion material configured to convert the incident light into the ultraviolet light.

Optionally, the second barrier layer has a height relative to the base substrate greater than a height relative to the base substrate of the first barrier layer; and the third barrier layer has a height relative to the base substrate greater than the height relative to the base substrate of the second barrier layer.

Optionally, the encapsulating layer further comprises a third inorganic encapsulating sub-layer encapsulating the plurality of light emitting elements, the first barrier layer, the second barrier layer, the third barrier layer, the first inorganic encapsulating sub-layer, the second inorganic encapsulating sub-layer, the first organic encapsulating sub-layer, and the second organic encapsulating sub-layer.

In another aspect, the present invention provides a display apparatus comprising the display substrate described herein.

In another aspect, the present invention provides a method of fabricating a display substrate having a display area and a peripheral area, comprising forming a plurality of light emitting elements on a base substrate and in the display area; forming an encapsulating layer on a side of the plurality of light emitting elements distal to the base substrate to encapsulate the plurality of light emitting elements; and forming a first barrier layer on the base substrate and in the peripheral area, the first barrier layer forming a first enclosure substantially surrounding a first area; wherein the first barrier layer is formed using a material comprising an up-conversion material configured to convert an incident light into an ultraviolet light; and wherein forming the encapsulating layer comprises forming a first organic encapsulating sub-layer on the base substrate.

Optionally, forming the first organic encapsulating sub-layer comprises forming a first organic material layer substantially enclosed inside the first area; subsequent to forming the first organic material layer, irradiating the first barrier layer by the incident light, the first barrier layer converting the incident light into the ultraviolet light; and curing a peripheral portion of the first organic material layer by the ultraviolet light converted by the first barrier layer, thereby stabilizing the peripheral portion of the first organic material layer.

Optionally, the method further comprises forming a first inorganic encapsulating sub-layer encapsulating the plurality of light emitting elements and the first barrier layer; wherein the first organic encapsulating sub-layer is formed on a side of the first inorganic encapsulating sub-layer distal to the base substrate.

Optionally, the method further comprises forming a second barrier layer on the base substrate and in the peripheral area, the second barrier layer forming a second enclosure substantially surrounding a second area, the second area being larger than the first area; wherein the first inorganic encapsulating sub-layer is formed to encapsulate the plurality of light emitting elements, the first barrier layer, and the second barrier layer; and the first inorganic encapsulating sub-layer is formed to be in contact with the base substrate in an area between the first barrier layer and the second barrier layer.

Optionally, the first organic encapsulating sub-layer is formed to be substantially enclosed inside the second area; wherein forming the first organic encapsulating sub-layer comprises forming a first organic material layer substantially enclosed inside the second area; subsequent to forming the first organic material layer, irradiating the first barrier layer by the incident light, the first barrier layer converting the incident light into the ultraviolet light; and curing a peripheral portion of the first organic material layer by the ultraviolet light converted by the first barrier layer, thereby stabilizing the peripheral portion of the first organic material layer.

Optionally, the second barrier layer is formed using a material comprising the up-conversion material configured to convert the incident light into the ultraviolet light; and wherein forming the encapsulating layer further comprises forming a first organic encapsulating sub-layer on a side of the first inorganic encapsulating sub-layer distal to the base substrate, and substantially enclosed inside the second area; wherein forming the first organic encapsulating sub-layer comprises forming a first organic material layer substantially enclosed inside the second area; subsequent to forming the first organic material layer, irradiating the first barrier layer and the second barrier layer by the incident light, the first barrier layer and the second barrier layer converting the incident light into the ultraviolet light; and curing a peripheral portion of the first organic material layer by the ultraviolet light converted by the first barrier layer and the second barrier layer, thereby stabilizing the peripheral portion of the first organic material layer.

Optionally, the second barrier layer is formed to have a height relative to the base substrate greater than a height relative to the base substrate of the first barrier layer.

Optionally, the first barrier layer and the second barrier layer are formed to be spaced apart from each other by a distance in a range of approximately 0.5 mm to approximately 2 mm; and each of the first barrier layer and the second barrier layer is formed to have a lateral thickness in a range of approximately 10 μm to approximately 20 μm.

Optionally, forming the encapsulating layer further comprises forming a second inorganic encapsulating sub-layer on a side of the first organic encapsulating sub-layer distal to the base substrate, encapsulating the plurality of light emitting elements, the first barrier layer, the second barrier layer, the first inorganic encapsulating sub-layer, and the first organic encapsulating sub-layer.

Optionally, forming the encapsulating layer further comprises forming a second organic encapsulating sub-layer on a side of the second inorganic encapsulating sub-layer distal to the base substrate, and the second organic encapsulating sub-layer is formed to be substantially enclosed inside the second area.

Optionally, forming the encapsulating layer further comprises forming a third inorganic encapsulating sub-layer on a side of the second organic encapsulating sub-layer distal to the base substrate.

Optionally, the method further comprises forming a third barrier layer on the base substrate and in the peripheral area, the third barrier layer forming a third enclosure substantially surrounding a third area, the third area being larger than the second area; wherein the first inorganic encapsulating sub-layer is formed on a side of the first barrier layer, the second barrier layer, and the third barrier layer distal to the base substrate, encapsulating the plurality of light emitting elements, the first barrier layer, the second barrier layer, and the third barrier layer; the first inorganic encapsulating sub-layer is formed to be in contact with the base substrate in an area between the second barrier layer and the third barrier layer; and the second inorganic encapsulating sub-layer is formed on a side of the first inorganic encapsulating sub-layer and the first organic encapsulating sub-layer distal to the base substrate, encapsulating the plurality of light emitting elements, the first barrier layer, the second barrier layer, the third barrier layer, the first inorganic encapsulating sub-layer, and the first organic encapsulating sub-layer.

Optionally, forming the encapsulating layer further comprises forming a second organic encapsulating sub-layer on a side of the second inorganic encapsulating sub-layer distal to the base substrate, and the second organic encapsulating sub-layer is formed to be substantially enclosed inside the third area; wherein forming the second organic encapsulating sub-layer comprises forming a second organic material layer substantially enclosed inside the third area; subsequent to forming the second organic material layer, irradiating the second barrier layer and the third barrier layer by the incident light, the second barrier layer and the third barrier layer converting the incident light into the ultraviolet light; and curing a peripheral portion of the second organic material layer by the ultraviolet light converted by the second barrier layer and the third barrier layer, thereby stabilizing the peripheral portion of the second organic material layer.

Optionally, the third barrier layer is formed using a material comprising the up-conversion material configured to convert the incident light into the ultraviolet light.

Optionally, the second barrier layer is formed to have a height relative to the base substrate greater than a height relative to the base substrate of the first barrier layer; and the third barrier layer is formed to have a height relative to the base substrate greater than the height relative to the base substrate of the second barrier layer.

Optionally, forming the encapsulating layer further comprises forming a third inorganic encapsulating sub-layer encapsulating the plurality of light emitting elements, the first barrier layer, the second barrier layer, the third barrier layer, the first inorganic encapsulating sub-layer, the second inorganic encapsulating sub-layer, the first organic encapsulating sub-layer, and the second organic encapsulating sub-layer.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
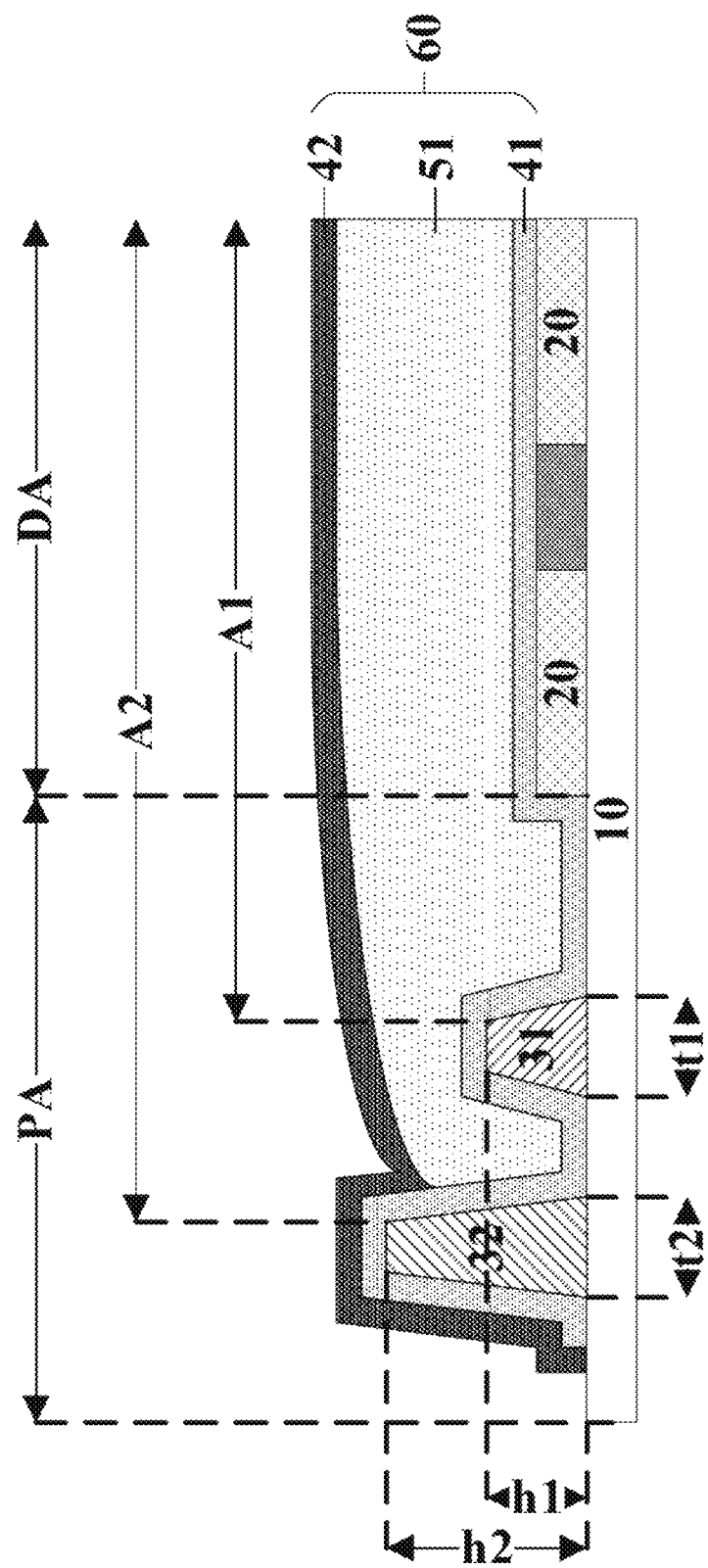
FIG. 1 is a schematic diagram illustrating the structure of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating an encapsulating layer for a display substrate, e.g., an organic light emitting diode display substrate, multiple sub-layers including one or more inorganic sub-layers and one or more organic sub-layers are formed on the display substrate. The organic sub-layers may be formed by printing (e.g., ink-jet printing) an organic ink onto the display substrate, and curing the organic ink to form the organic sub-layer. Typically, the organic ink is allowed to be substantially leveled before it is cured, e.g., by an ultraviolet light. In some embodiments, the display substrate includes one or more barrier layer to hold the organic ink in a defined region before it is cured. However, often the organic ink climbs over the barrier layer. When the organic ink is cured to form an organic sub-layer, and an inorganic sub-layer is subsequently formed on top of the organic sub-layer, the organic sub-layer extends outside the inorganic sub-layer. Because the organic sub-layer is not completely encapsulated by the inorganic sub-layer, the display substrate has an inferior oxygen and moisture resistance.

Accordingly, the present disclosure provides, inter alia, a display substrate having a display area and a peripheral area, a display apparatus, and a method of fabricating a display substrate that substantially obviate one or more of the problems due to limitations and disadvantages of the related art. In one aspect, the present disclosure provides a display substrate having a display area and a peripheral area. In some embodiments, the display substrate includes a base substrate; a plurality of light emitting elements on the base substrate and in the display area; an encapsulating layer on a side of the plurality of light emitting elements distal to the base substrate to encapsulate the plurality of light emitting elements; and a first barrier layer on the base substrate and in the peripheral area and forming a first enclosure substantially surrounding a first area. The first barrier layer includes an up-conversion material configured to convert an incident light into an ultraviolet light. Optionally, the up-conversion material is capable of converting an infrared light into an ultraviolet light. Optionally, the up-conversion material is capable of converting a visible light into an ultraviolet light. The encapsulating layer includes a first organic encapsulating sub-layer on a side of the first barrier layer distal to the base substrate.

As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

As used herein the term "substantially surrounding" refers to surrounding at least 50% (e.g., at least 60%, at least 70%, at least 80%, at least 90%, at least 95%, at least 99%, and 100%) of a perimeter of an area.

FIG. 1 is a schematic diagram illustrating the structure of a display substrate in some embodiments according to the present disclosure. Referring to FIG. 1, the display substrate in some embodiments has a display area DA and a peripheral area PA. In some embodiments, the display substrate includes a base substrate 10; a plurality of light emitting elements 20 on the base substrate 10 and in the display area DA; an encapsulating layer 60 on a side of the plurality of light emitting elements 20 distal to the base substrate 10 to encapsulate the plurality of light emitting elements 20; and a first barrier layer 31 on the base substrate 10 and in the peripheral area PA and forming a first enclosure substantially surrounding a first area A1. The first barrier layer 31 includes an up-conversion material configured to convert an incident light into an ultraviolet light. Optionally, the up-conversion material is capable of converting an infrared light into an ultraviolet light. Optionally, the up-conversion material is capable of converting a visible light into an ultraviolet light.

Various appropriate materials and various appropriate fabricating methods may be used for making the first barrier layer 31. For example, a barrier material may be deposited on the substrate by a plasma-enhanced chemical vapor deposition (PECVD) process. Examples of appropriate barrier materials include a polymer material containing one or more up-conversion materials. Examples of appropriate polymer materials include resins and photoresist materials. Examples of appropriate up-conversion materials includes a compound having one or more rare earth elements, e.g., an oxide of one or more rare earth elements, a halide (e.g., a fluoride) of one or more rare earth elements, an oxyfluoride of one or more rare earth elements, a sulfide of one or more rare earth elements, and any combination thereof. Examples of appropriate rare earth elements for making the up-conversion materials include Lanthanum, Cerium, Praseodymium, Neodymium, Promethium, Samarium, Europium, Gadolinium, Terbium, Dysprosium, Holmium, Erbium, Thulium, Ytterbium, Lutetium, Scandium, and Yttrium. In one example, the first barrier layer 31 is made of a photoresist resin including 10% weight/weight β-NaYF_4:Yb~(3+), Tm~(3+)/CdSe nanocrystals.

Optionally, the first barrier layer 31 has a lateral thickness t1 in a range of approximately 5 μm to approximately 50 μm, e.g., approximately 5 μm to approximately 10 μm, approximately 10 μm to approximately 15 μm, approximately 15 μm to approximately 20 μm, approximately 20 μm to approximately 25 μm, approximately 25 μm to approximately 30 μm, approximately 30 μm to approximately 35 μm, approximately 35 μm to approximately 40 μm, approximately 40 μm to approximately 45 μm, and approximately 45 μm to approximately 50 μm.

The first barrier layer 31 may have a cross-section of any appropriate shapes. Examples of appropriate shapes of the cross-section of the first barrier layer 31 includes a circular shape, a trapezoidal shape, an inverted trapezoidal shape, an elliptical shape, a square shape, and a triangular shape.

Optionally, the first barrier layer 31 has a height h1 relative to the base substrate 10 in a range of approximately 0.5 μm to approximately 5 μm, e.g., approximately 0.5 μm to approximately 1 μm, approximately 1 μm to approximately 1.5 μm, approximately 1.5 μm to approximately 2 μm, approximately 2 μm to approximately 2.5 μm, approximately 2.5 μm to approximately 3 μm, approximately 3 μm to approximately 3.5 μm, approximately 3.5 μm to approximately 4 μm, approximately 4 μm to approximately 4.5 μm, and approximately 4.5 μm to approximately 5 μm. In one example, the first barrier layer 31 has a height h1 relative to the base substrate 10 of approximately 2 μm.

The display substrate further includes a second barrier layer 32 on the base substrate 10 and in the peripheral area PA and forming a second enclosure substantially surrounding a second area A2, the second area A2 being larger than the first area A1.

Various appropriate materials and various appropriate fabricating methods may be used for making the second barrier layer 32. For example, a barrier material may be deposited on the substrate by a plasma-enhanced chemical vapor deposition (PECVD) process. Examples of appropriate barrier materials include a polymer material such as various resins and photoresist materials.

Optionally, the second barrier layer 32 also includes an up-conversion material configured to convert the incident light into the ultraviolet light. Examples of appropriate up-conversion materials includes a compound having one or more rare earth elements, e.g., an oxide of one or more rare earth elements, a halide (e.g., a fluoride) of one or more rare earth elements, an oxyfluoride of one or more rare earth elements, a sulfide of one or more rare earth elements, and any combination thereof. Examples of appropriate rare earth elements for making the up-conversion materials include Lanthanum, Cerium, Praseodymium, Neodymium, Promethium, Samarium, Europium, Gadolinium, Terbium, Dysprosium, Holmium, Erbium, Thulium, Ytterbium, Lutetium, Scandium, and Yttrium.

Optionally, the second barrier layer 32 does not include an up-conversion material.

Optionally, the second barrier layer 32 has a lateral thickness t2 in a range of approximately 5 μm to approximately 50 μm, e.g., approximately 5 μm to approximately 10 μm, approximately 10 μm to approximately 15 μm, approximately 15 μm to approximately 20 μm, approximately 20 μm to approximately 25 μm, approximately 25 μm to approximately 30 μm, approximately 30 μm to approximately 35 μm, approximately 35 μm to approximately 40 μm, approximately 40 μm to approximately 45 μm, and approximately 45 μm to approximately 50 μm.

The second barrier layer 32 may have a cross-section of any appropriate shapes. Examples of appropriate shapes of the cross-section of the second barrier layer 32 includes a circular shape, a trapezoidal shape, an inverted trapezoidal shape, an elliptical shape, a square shape, and a triangular shape.

Optionally, the second barrier layer 32 has a height h2 relative to the base substrate 10 in a range of approximately 0.5 μm to approximately 5 μm, e.g., approximately 0.5 μm to approximately 1 μm, approximately 1 μm to approximately 1.5 μm, approximately 1.5 μm to approximately 2 μm, approximately 2 μm to approximately 2.5 μm, approximately 2.5 μm to approximately 3 μm, approximately 3 μm to approximately 3.5 μm, approximately 3.5 μm to approximately 4 μm, approximately 4 μm to approximately 4.5 μm, and approximately 4.5 μm to approximately 5 μm. In one example, the second barrier layer 32 has a height h2 relative to the base substrate 10 of approximately 3 μm.

Optionally, the second barrier layer 32 has a height h2 relative to the base substrate 10 greater than a height h1 relative to the base substrate 10 of the first barrier layer 31. Optionally, the height h2 relative to the base substrate 10 of the second barrier layer 32 is approximately twice the height h1 relative to the base substrate 10 of the first barrier layer 31. Optionally, the first barrier layer 31 has a height h1 relative to the base substrate 10 in a range of approximately 1 μm to approximately 2 μm, and the second barrier layer 32 has a height h2 relative to the base substrate 10 in a range of approximately 3 μm to approximately 4 μm.

Optionally, the first barrier layer 31 and the second barrier layer 32 are spaced apart from each other by a distance in a range of approximately 0.5 mm to approximately 5 mm, e.g., approximately 0.5 mm to approximately 1 mm, approximately 1 mm to approximately 1.5 mm, approximately 1.5 mm to approximately 2 mm, approximately 2 mm to approximately 2.5 mm, approximately 2.5 mm to approximately 3 mm, approximately 3 mm to approximately 3.5 mm, approximately 3.5 mm to approximately 4 mm, approximately 4 mm to approximately 4.5 mm, and approximately 4.5 mm to approximately 5 mm. In one example, the first barrier layer 31 and the second barrier layer 32 are spaced apart from each other by a distance of approximately 1 mm.

In some embodiments, the encapsulating layer 60 includes a first inorganic encapsulating sub-layer 41 encapsulating the plurality of light emitting elements 20, the first barrier layer 31, and the second barrier layer 32. Optionally, the first inorganic encapsulating sub-layer 41 is in contact with the base substrate 10 in an area between the first barrier layer 31 and the second barrier layer 32.

Various appropriate inorganic encapsulating materials and various appropriate fabricating methods may be used to make the first inorganic encapsulating sub-layer 41. For example, an inorganic encapsulating material may be deposited on the substrate by a plasma-enhanced chemical vapor deposition (PECVD) process or an atomic layer deposition process. Examples of appropriate inorganic encapsulating materials include, but are not limited to, silicon oxide ($SiO_y$), silicon nitride ($SiN_y$, e.g., $Si_3N_4$), silicon oxynitride ($SiO_xN_y$), silicon carbide (SiC), aluminum oxide, zinc sulfide, and zinc oxide. Optionally, the first inorganic encapsulating sub-layer 41 has a thickness in a range of approximately 0.05 µm to approximately 2.5 µm. The first inorganic encapsulating sub-layer 41 is made of a substantially transparent material. As used herein, the term "substantially transparent" means at least 50 percent (e.g., at least 60 percent, at least 70 percent, at least 80 percent, at least 90 percent, and at least 95 percent) of light in the visible wavelength range transmitted therethrough. In one example, the first inorganic encapsulating sub-layer 41 includes silicon nitride and have a thickness of approximately 1 µm, and is formed using a chemical vapor deposition process.

In some embodiments, the encapsulating layer 60 further includes a first organic encapsulating sub-layer 51 on a side of the first inorganic encapsulating sub-layer 41 distal to the base substrate 10, and substantially enclosed inside the second area A2 by the second barrier layer 32.

Various appropriate organic encapsulating materials and various appropriate fabricating methods may be used to make the first organic encapsulating sub-layer 51. For example, an organic encapsulating material may be deposited on the substrate by ink-jet printing or coating. Optionally, the first organic encapsulating sub-layer 51 is made from a polymerizable monomer (e.g., >95% v/v). Optionally, the first organic encapsulating sub-layer 51 is made by curing the polymerizable monomer, e.g., using a UV light. Optionally, the first organic encapsulating sub-layer 51 is made by curing a mixture including the polymerizable monomer, a photo-initiator, a reactive diluent, and one or more additional agents. Optionally, the first organic encapsulating sub-layer 51 has a thickness in a range of approximately 10 µm to approximately 20 µm.

Referring to FIG. 1, the encapsulating layer 60 in some embodiments further includes a second inorganic encapsulating sub-layer 42 encapsulating the plurality of light emitting elements 20, the first barrier layer 31, the second barrier layer 32, and the first organic encapsulating sub-layer 51.

Various appropriate inorganic encapsulating materials and various appropriate fabricating methods may be used to make the second inorganic encapsulating sub-layer 42. For example, an inorganic encapsulating material may be deposited on the substrate by a plasma-enhanced chemical vapor deposition (PECVD) process or an atomic layer deposition process. Examples of appropriate inorganic encapsulating materials include, but are not limited to, silicon oxide ($SiO_y$), silicon nitride ($SiN_y$, e.g., $Si_3N_4$), silicon oxynitride ($SiO_xN_y$), silicon carbide (SiC), aluminum oxide, zinc sulfide, and zinc oxide. Optionally, the second inorganic encapsulating sub-layer 42 has a thickness in a range of approximately 0.05 µm to approximately 2.5 µm. The second inorganic encapsulating sub-layer 42 is made of a substantially transparent material. In one example, the second inorganic encapsulating sub-layer 42 includes aluminum oxide and have a thickness of approximately 0.05 µm, and is formed using an atomic layer deposition process.

Figure 2:
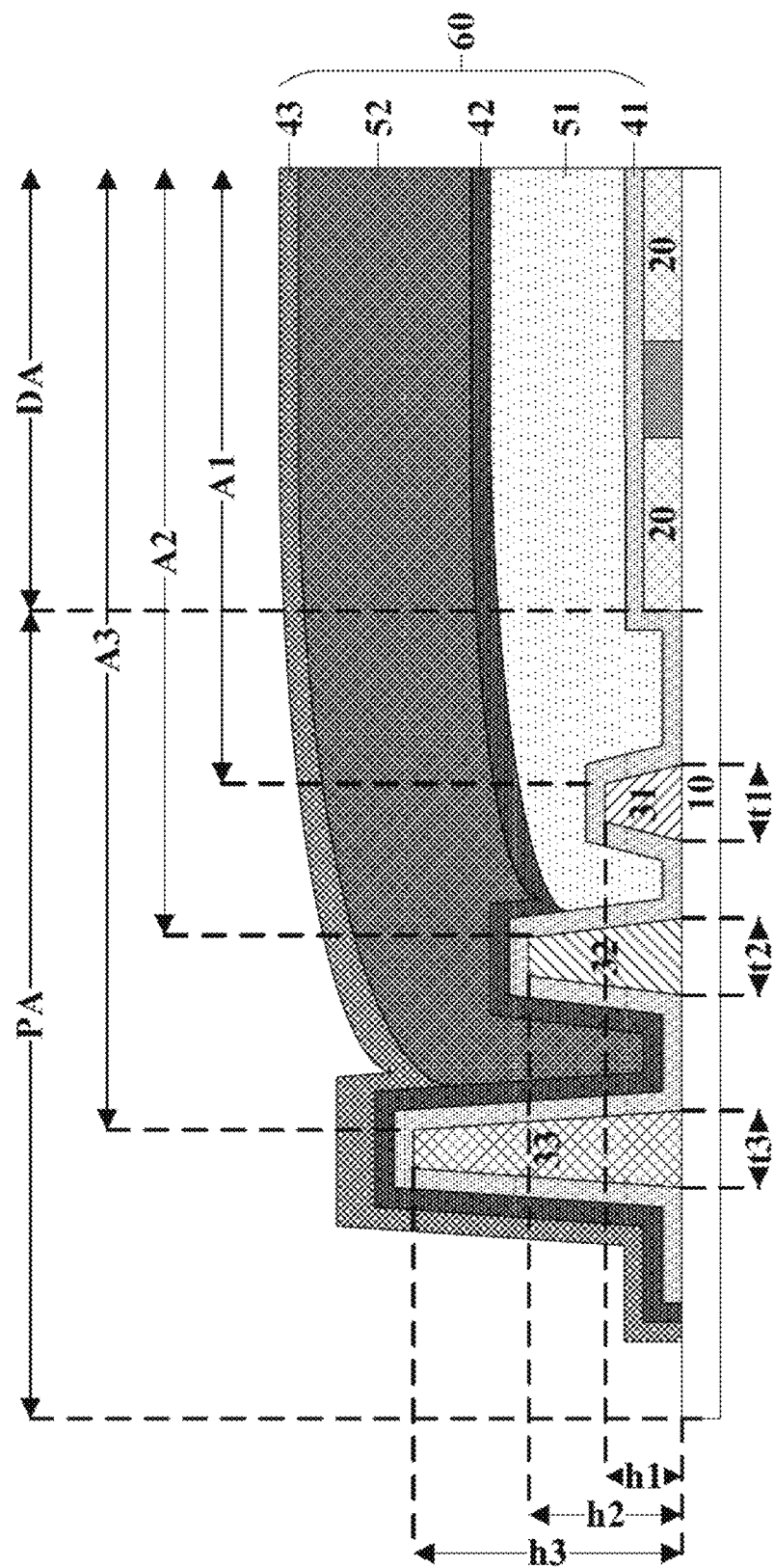
FIG. 2 is a schematic diagram illustrating the structure of a display substrate in some embodiments according to the present disclosure.

FIG. 2 is a schematic diagram illustrating the structure of a display substrate in some embodiments according to the present disclosure. Referring to FIG. 2, the display substrate in some embodiments further includes a third barrier layer 33 on the base substrate 10 and in the peripheral area PA and forming a third enclosure substantially surrounding a third area A3, the third area A3 being larger than the second area A2. Optionally, a first organic encapsulating sub-layer 51 is on a side of the first inorganic encapsulating sub-layer 41 distal to the base substrate 10, and substantially enclosed inside the second area A2 by the second barrier layer 32. Optionally, the first inorganic encapsulating sub-layer 41 is on a side of the first barrier layer 31, the second barrier layer 32, and the third barrier layer 33 distal to the base substrate 10, encapsulating the plurality of light emitting elements 20, the first barrier layer 31, the second barrier layer 32, and the third barrier layer 33. Optionally, the first inorganic encapsulating sub-layer 41 is in contact with the base substrate 10 in an area between the first barrier layer 31 and the second barrier layer 32, and in an area between the second barrier layer 32 and the third barrier layer 33. Optionally, the second inorganic encapsulating sub-layer 42 is on a side of the first inorganic encapsulating sub-layer 41 and the first organic encapsulating sub-layer 51 distal to the base substrate 10. The second inorganic encapsulating sub-layer 42 encapsulates the plurality of light emitting elements 20, the first barrier layer 31, the second barrier layer 32, the third barrier layer 33, the first inorganic encapsulating sub-layer 41, and the first organic encapsulating sub-layer 51.

Various appropriate materials and various appropriate fabricating methods may be used for making the third barrier layer 33. For example, a barrier material may be deposited on the substrate by a plasma-enhanced chemical vapor deposition (PECVD) process. Examples of appropriate barrier materials include a polymer material such as various resins and photoresist materials.

Optionally, the third barrier layer 33 also includes an up-conversion material configured to convert the incident light into the ultraviolet light. Examples of appropriate up-conversion materials includes a compound having one or more rare earth elements, e.g., an oxide of one or more rare earth elements, a halide (e.g., a fluoride) of one or more rare earth elements, an oxyfluoride of one or more rare earth elements, a sulfide of one or more rare earth elements, and any combination thereof. Examples of appropriate rare earth elements for making the up-conversion materials include Lanthanum, Cerium, Praseodymium, Neodymium, Promethium, Samarium, Europium, Gadolinium, Terbium, Dysprosium, Holmium, Erbium, Thulium, Ytterbium, Lutetium, Scandium, and Yttrium.

Optionally, the third barrier layer 33 does not include an up-conversion material.

Optionally, the third barrier layer 33 has a lateral thickness t3 in a range of approximately 5 µm to approximately 50 µm, e.g., approximately 5 µm to approximately 10 µm, approximately 10 µm to approximately 15 µm, approximately 15 µm to approximately 20 µm, approximately 20 µm to approximately 25 µm, approximately 25 µm to approximately 30 µm, approximately 30 µm to approximately 35 µm, approximately 35 µm to approximately 40 µm, approximately 40 µm to approximately 45 µm, and approximately 45 µm to approximately 50 µm.

The third barrier layer 33 may have a cross-section of any appropriate shapes. Examples of appropriate shapes of the cross-section of the third barrier layer 33 includes a circular shape, a trapezoidal shape, an inverted trapezoidal shape, an elliptical shape, a square shape, and a triangular shape.

Optionally, the third barrier layer 33 has a height h3 relative to the base substrate 10 in a range of approximately 0.5 µm to approximately 5 µm, e.g., approximately 0.5 µm to approximately 1 µm, approximately 1 µm to approximately 1.5 µm, approximately 1.5 µm to approximately 2 µm, approximately 2 µm to approximately 2.5 µm, approximately 2.5 µm to approximately 3 µm, approximately 3 µm to approximately 3.5 µm, approximately 3.5 µm to approximately 4 µm, approximately 4 µm to approximately 4.5 µm, and approximately 4.5 µm to approximately 5 µm. In one example, the third barrier layer 33 has a height h3 relative to the base substrate 10 of approximately 4 µm.

Optionally, the third barrier layer 33 has a height h3 relative to the base substrate 10 greater than a height h2 relative to the base substrate 10 of the second barrier layer 32. Optionally, the height h3 relative to the base substrate 10 of the third barrier layer 33 is approximately twice the height h2 relative to the base substrate 10 of the second barrier layer 32. Optionally, the second barrier layer 32 has a height h2 relative to the base substrate 10 in a range of approximately 3 µm to approximately 4 µm, and the third barrier layer 33 has a height h3 relative to the base substrate 10 in a range of approximately 4 µm to approximately 6 µm.

Optionally, the second barrier layer 32 and the third barrier layer 33 are spaced apart from each other by a distance in a range of approximately 0.5 mm to approximately 5 mm, e.g., approximately 0.5 mm to approximately 1 mm, approximately 1 mm to approximately 1.5 mm, approximately 1.5 mm to approximately 2 mm, approximately 2 mm to approximately 2.5 mm, approximately 2.5 mm to approximately 3 mm, approximately 3 mm to approximately 3.5 mm, approximately 3.5 mm to approximately 4 mm, approximately 4 mm to approximately 4.5 mm, and approximately 4.5 mm to approximately 5 mm. In one example, the second barrier layer 32 and the third barrier layer 33 are spaced apart from each other by a distance of approximately 1 mm.

Referring to FIG. 2, in some embodiments, the encapsulating layer 60 further comprises a second organic encapsulating sub-layer 52 on a side of the second inorganic encapsulating sub-layer 42 distal to the base substrate 10, and substantially enclosed inside the third area A3.

Various appropriate organic encapsulating materials and various appropriate fabricating methods may be used to make the second organic encapsulating sub-layer 52. For example, an organic encapsulating material may be deposited on the substrate by ink-jet printing or coating. Optionally, the second organic encapsulating sub-layer 52 is made from a polymerizable monomer (e.g., >95% v/v). Optionally, the second organic encapsulating sub-layer 52 is made by curing the polymerizable monomer. e.g., using a UV light. Optionally, the second organic encapsulating sub-layer 52 is made by curing a mixture including the polymerizable monomer, a photo-initiator, a reactive diluent, and one or more additional agents. Optionally, the second organic encapsulating sub-layer 52 has a thickness in a range of approximately 10 µm to approximately 20 µm.

Referring to FIG. 2, the encapsulating layer 60 in some embodiments further includes a third inorganic encapsulating sub-layer 43 encapsulating the plurality of light emitting elements 20, the first barrier layer 31, the second barrier layer 32, the third barrier layer 33, the first inorganic encapsulating sub-layer 41, the second inorganic encapsulating sub-layer 42, the first organic encapsulating sub-layer 51, and the second organic encapsulating sub-layer 52.

Various appropriate inorganic encapsulating materials and various appropriate fabricating methods may be used to make the third inorganic encapsulating sub-layer 43. For example, an inorganic encapsulating material may be deposited on the substrate by a plasma-enhanced chemical vapor deposition (PECVD) process or an atomic layer deposition process. Examples of appropriate inorganic encapsulating materials include, but are not limited to, silicon oxide ($SiO_y$), silicon nitride ($SiN_y$, e.g., $Si_3N_4$), silicon oxynitride ($SiO_xN_y$), silicon carbide (SiC), aluminum oxide, zinc sulfide, and zinc oxide. Optionally, the third inorganic encapsulating sub-layer 43 has a thickness in a range of approximately 0.05 µm to approximately 2.5 µm. The third inorganic encapsulating sub-layer 43 is made of a substantially transparent material. In one example, the third inorganic encapsulating sub-layer 43 includes silicon oxide and have a thickness of approximately 1 µm, and is formed using a chemical vapor deposition process.

Optionally, the display substrate includes additional barrier layer(s), additional inorganic encapsulating sub-layer(s), and/or additional organic encapsulating sub-layer(s).

Figure 3:
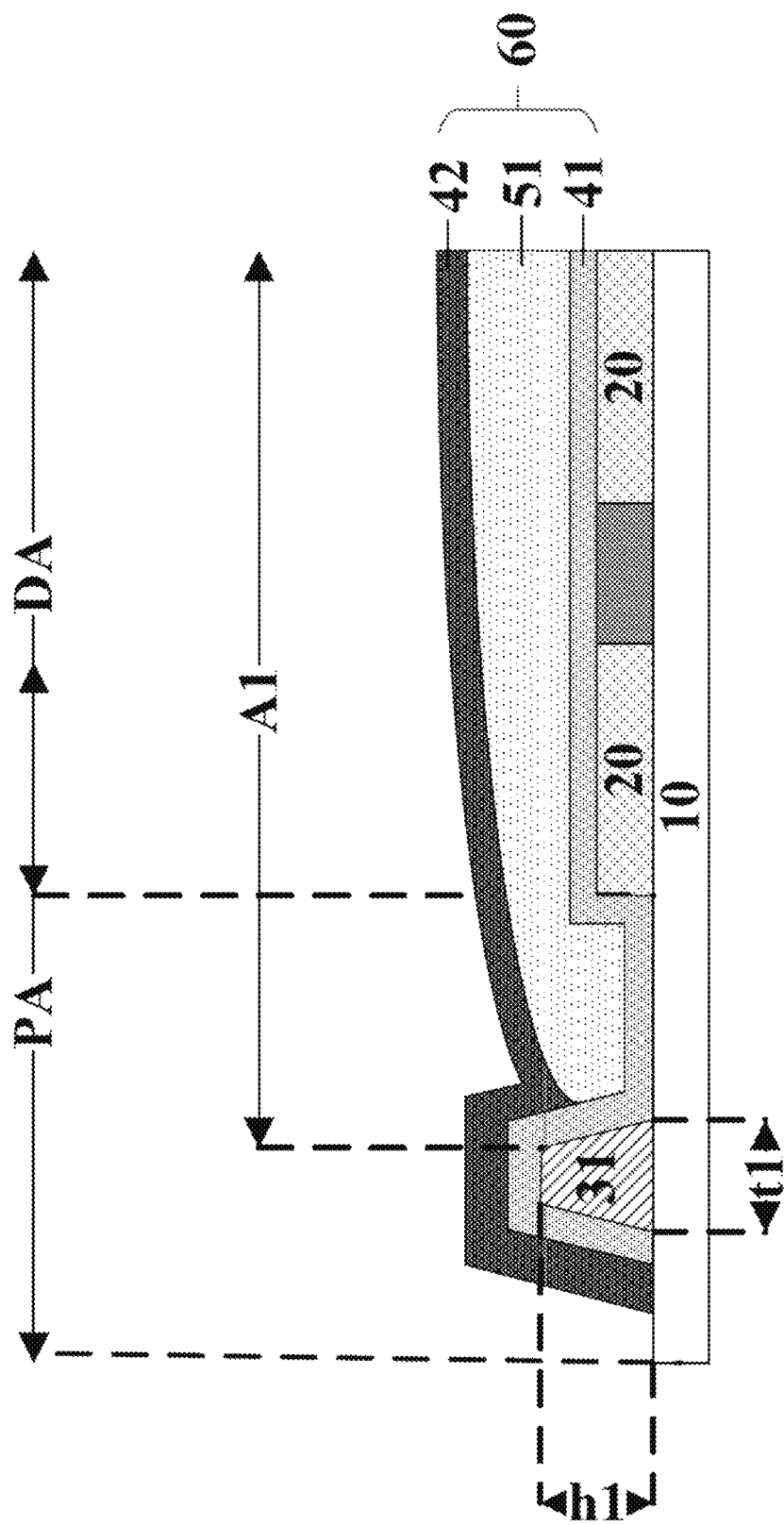
FIG. 3 is a schematic diagram illustrating the structure of a display substrate in some embodiments according to the present disclosure.

FIG. 3 is a schematic diagram illustrating the structure of a display substrate in some embodiments according to the present disclosure. Referring to FIG. 3, the display substrate in some embodiments includes a base substrate 10; a plurality of light emitting elements 20 on the base substrate 10 and in the display area DA; an encapsulating layer 60 on a side of the plurality of light emitting elements 20 distal to the base substrate 10 to encapsulate the plurality of light emitting elements 20; and a first barrier layer 31 on the base substrate 10 and in the peripheral area PA and forming a first enclosure substantially surrounding a first area A1. The first barrier layer 31 includes an up-conversion material configured to convert an incident light into an ultraviolet light. Optionally, the up-conversion material is capable of converting an infrared light into an ultraviolet light. Optionally, the up-conversion material is capable of converting a visible light into an ultraviolet light.

In some embodiments, the encapsulating layer 60 includes a first inorganic encapsulating sub-layer 41 encapsulating the plurality of light emitting elements 20 and the first barrier layer 31; a first organic encapsulating sub-layer 51 on a side of the first inorganic encapsulating sub-layer 41 distal to the base substrate 10; and a second inorganic encapsulating sub-layer 42 on a side of the first organic encapsulating sub-layer 51 distal to the base substrate 10 and encapsulating the plurality of light emitting elements 20, the first inorganic encapsulating sub-layer 41, and the first organic encapsulating sub-layer 51.

Optionally, the first barrier layer 31 has a lateral thickness t1 in a range of approximately 5 μm to approximately 50 μm, e.g., approximately 5 μm to approximately 10 μm, approximately 10 μm to approximately 15 μm, approximately 15 μm to approximately 20 μm, approximately 20 μm to approximately 25 μm, approximately 25 μm to approximately 30 μm, approximately 30 μm to approximately 35 μm, approximately 35 μm to approximately 40 μm, approximately 40 μm to approximately 45 μm, and approximately 45 μm to approximately 50 μm.

Optionally, the first barrier layer 31 has a height h1 relative to the base substrate 10 in a range of approximately 0.5 μm to approximately 5 μm, e.g., approximately 0.5 μm to approximately 1 μm, approximately 1 μm to approximately 1.5 μm, approximately 1.5 μm to approximately 2 μm, approximately 2 μm to approximately 2.5 μm, approximately 2.5 μm to approximately 3 μm, approximately 3 μm to approximately 3.5 μm, approximately 3.5 μm to approximately 4 μm, approximately 4 μm to approximately 4.5 μm, and approximately 4.5 μm to approximately 5 μm. In one example, the first barrier layer 31 has a height h1 relative to the base substrate 10 of approximately 2 μm.

Figure 4:
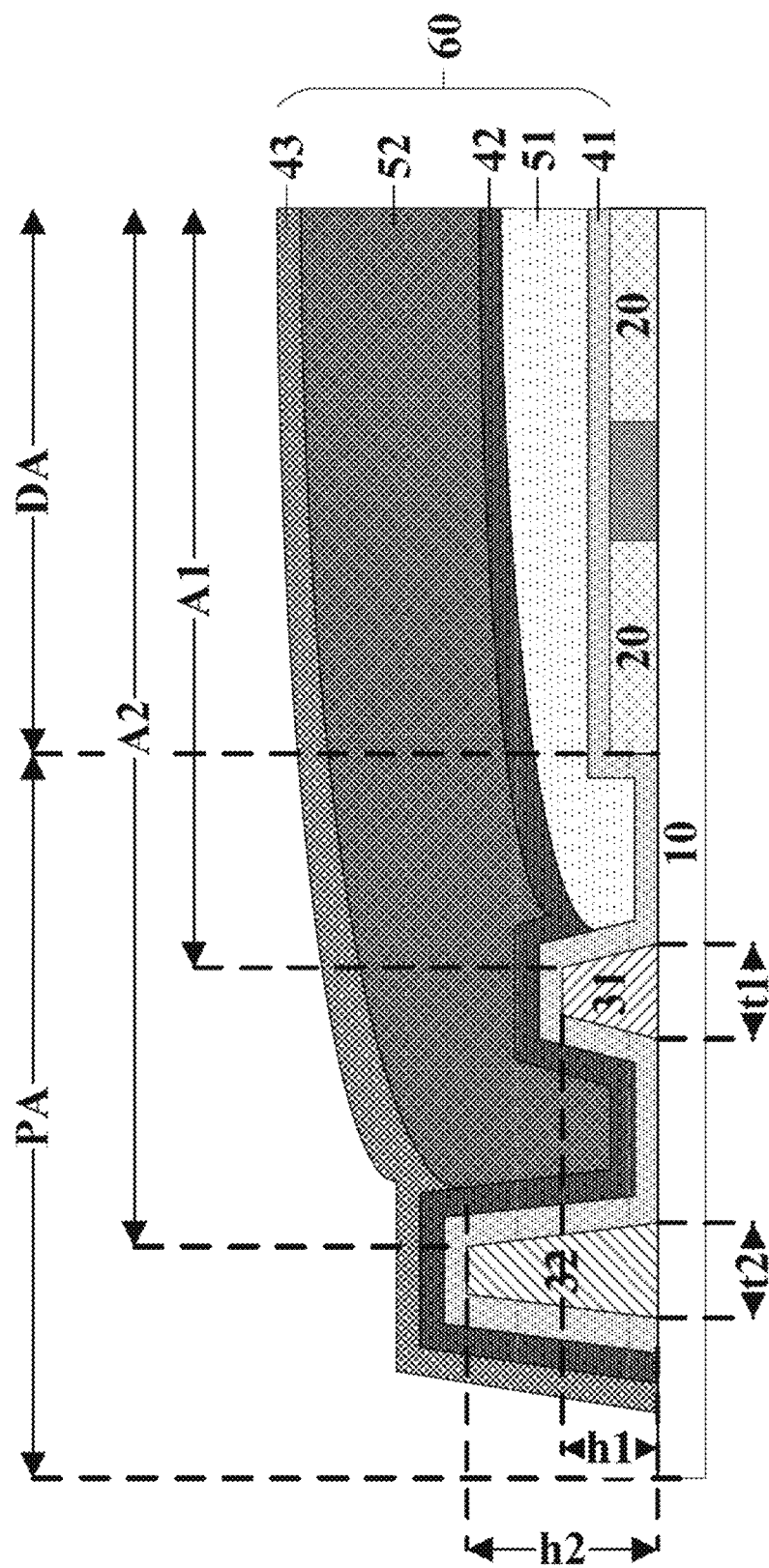
FIG. 4 is a schematic diagram illustrating the structure of a display substrate in some embodiments according to the present disclosure.

FIG. 4 is a schematic diagram illustrating the structure of a display substrate in some embodiments according to the present disclosure. Referring to FIG. 4, the display substrate in some embodiments includes a base substrate 10; a plurality of light emitting elements 20 on the base substrate 10 and in the display area DA; an encapsulating layer 60 on a side of the plurality of light emitting elements 20 distal to the base substrate 10 to encapsulate the plurality of light emitting elements 20; a first barrier layer 31 on the base substrate 10 and in the peripheral area PA and forming a first enclosure substantially surrounding a first area A1; a second barrier layer 32 on the base substrate 10 and in the peripheral area PA and forming a second enclosure substantially surrounding a second area A2, the second area A2 being larger than the first area A1. Optionally, the first barrier layer 31 includes an up-conversion material configured to convert an incident light into an ultraviolet light. Optionally, the second barrier layer 32 includes an up-conversion material configured to convert an incident light into an ultraviolet light.

In some embodiments, the encapsulating layer 60 includes a first inorganic encapsulating sub-layer 41 encapsulating the plurality of light emitting elements 20, the first barrier layer 31, and the second barrier layer 32; a first organic encapsulating sub-layer 51 on a side of the first inorganic encapsulating sub-layer 41 distal to the base substrate 10; a second inorganic encapsulating sub-layer 42 on a side of the first organic encapsulating sub-layer 51 distal to the base substrate 10 and encapsulating the plurality of light emitting elements 20, the first barrier layer 31, the second barrier layer 32, the first inorganic encapsulating sub-layer 41, and the first organic encapsulating sub-layer 51; a second organic encapsulating sub-layer 52 on a side of the second inorganic encapsulating sub-layer 42 distal to the base substrate 10; and a third inorganic encapsulating sub-layer 43 on a side of the second organic encapsulating sub-layer 52 distal to the base substrate 10 and encapsulating the plurality of light emitting elements 20, the first barrier layer 31, the second barrier layer 32, the first inorganic encapsulating sub-layer 41, the first organic encapsulating sub-layer 51, the second inorganic encapsulating sub-layer 42, and the second organic encapsulating sub-layer 52.

Optionally, the second barrier layer 32 has a height h2 relative to the base substrate 10 greater than a height h1 relative to the base substrate 10 of the first barrier layer 31. Optionally, the height h2 relative to the base substrate 10 of the second barrier layer 32 is approximately twice the height h1 relative to the base substrate 10 of the first barrier layer 31. Optionally, the first barrier layer 31 has a height h1 relative to the base substrate 10 in a range of approximately 1 μm to approximately 2 μm, and the second barrier layer 32 has a height h2 relative to the base substrate 10 in a range of approximately 3 μm to approximately 4 μm.

Optionally, the first barrier layer 31 and the second barrier layer 32 are spaced apart from each other by a distance in a range of approximately 0.5 mm to approximately 5 mm, e.g., approximately 0.5 mm to approximately 1 mm, approximately 1 mm to approximately 1.5 mm, approximately 1.5 mm to approximately 2 mm, approximately 2 mm to approximately 2.5 mm, approximately 2.5 mm to approximately 3 mm, approximately 3 mm to approximately 3.5 mm, approximately 3.5 mm to approximately 4 mm, approximately 4 mm to approximately 4.5 mm, and approximately 4.5 mm to approximately 5 mm. In one example, the first barrier layer 31 and the second barrier layer 32 are spaced apart from each other by a distance of approximately 1 mm.

Figure 5:
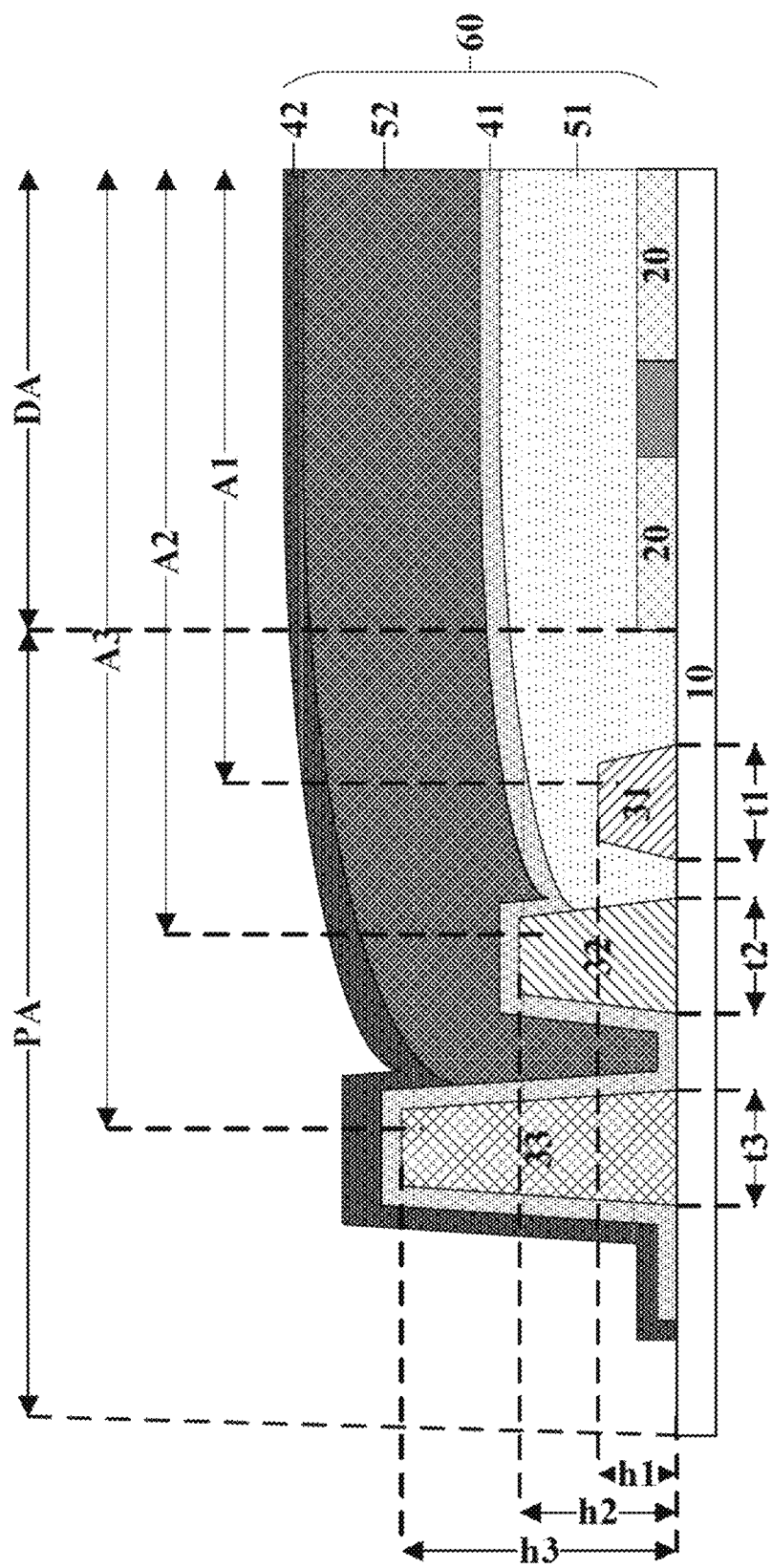
FIG. 5 is a schematic diagram illustrating the structure of a display substrate in some embodiments according to the present disclosure.

FIG. 5 is a schematic diagram illustrating the structure of a display substrate in some embodiments according to the present disclosure. Referring to FIG. 5, the display substrate includes a base substrate 10; a plurality of light emitting elements 20 on the base substrate 10 and in the display area DA; an encapsulating layer 60 on a side of the plurality of light emitting elements 20 distal to the base substrate 10 to encapsulate the plurality of light emitting elements 20; a first barrier layer 31 on the base substrate 10 and in the peripheral area PA and forming a first enclosure substantially surrounding a first area A1; a second barrier layer 32 on the base substrate 10 and in the peripheral area PA and forming a second enclosure substantially surrounding a second area A2, the second area A2 being larger than the first area A1; a third barrier layer 33 on the base substrate 10 and in the peripheral area PA and forming a third enclosure substantially surrounding a third area A3, the third area A3 being larger than the second area A2. The encapsulating layer 60 includes a first organic encapsulating sub-layer 51 on the base substrate 10, substantially enclosed inside the second area A2 by the second barrier layer 32, and encapsulating the plurality of light emitting elements 20 and the first barrier layer 31. The encapsulating layer 60 further includes a first inorganic encapsulating sub-layer 41 on a side of the first organic encapsulating sub-layer 51 distal to the base substrate 10, encapsulating the plurality of light emitting elements 20, the first barrier layer 31, the second barrier layer 32, the third barrier layer 33, and the first organic encapsulating sub-layer 51. The encapsulating layer 60 further includes a second organic encapsulating sub-layer 52 on a side of the first inorganic encapsulating sub-layer 41 distal to the base substrate 10, and substantially enclosed inside the third area A3. Moreover, the encapsulating layer 60 further includes a second inorganic encapsulating sub-layer 42 on a side of the second organic encapsulating sub-layer 52 distal to the base substrate 10, encapsulating the plurality of light emitting elements 20, the first barrier layer 31, the second barrier layer 32, the third barrier layer 33, the first organic encapsulating sub-layer 51, the first inorganic encapsulating sub-layer 41, and the second organic encapsulating sub-layer 52.

In another aspect, the present disclosure provides a display panel including a display substrate described herein. In some embodiments, the plurality of light emitting elements are a plurality of organic light emitting diodes, and the display panel is an organic light emitting diode display panel. In some embodiments, the plurality of light emitting elements are a plurality of quantum dots light emitting diodes, and the display panel is a quantum dots light emitting diode display panel. In some embodiments, the plurality of light emitting elements are a plurality of micro light emitting diodes, and the display panel is a micro light emitting diode display panel.

In another aspect, the present disclosure provides a display panel including a display apparatus described herein. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a display substrate having a display area and a peripheral area. In some embodiments, the method includes forming a plurality of light emitting elements on a base substrate and in the display area; forming an encapsulating layer on a side of the plurality of light emitting elements distal to the base substrate to encapsulate the plurality of light emitting elements; and forming a first barrier layer on the base substrate and in the peripheral area, the first barrier layer forming a first enclosure substantially surrounding a first area. The first barrier layer is formed using a material comprising an up-conversion material configured to convert an incident light into an ultraviolet light. The step of forming the encapsulating layer includes forming a first organic encapsulating sub-layer on a side of the first barrier layer distal to the base substrate.

Figure 6A:
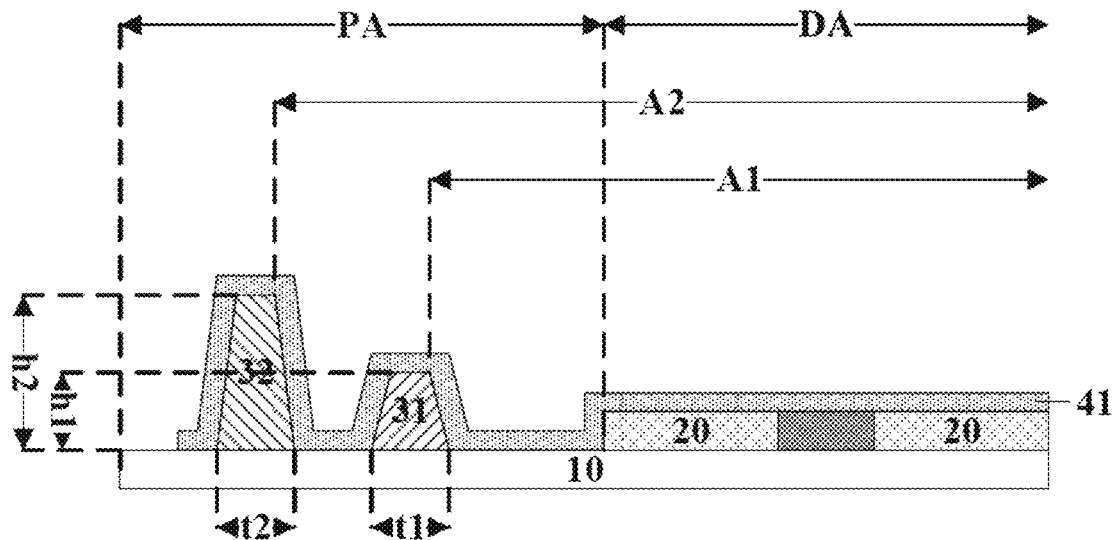
FIGS. 6A to 6D illustrate a process of fabricating a display substrate in some embodiments according to the present disclosure.

FIGS. 6A to 6D illustrate a process of fabricating a display substrate in some embodiments according to the present disclosure. Referring to FIG. 6A, a plurality of light emitting elements 20 are formed on a base substrate 10 and in the display area DA. A first barrier layer 31 is formed on the base substrate 10 and in the peripheral area PA. The first barrier layer 31 forms a first enclosure substantially surrounding a first area A1. A second barrier layer 32 is formed on the base substrate 10 and in the peripheral area PA. The second barrier layer 32 forms a second enclosure substantially surrounding a second area A2, the second area A2 being larger than the first area A1. A first inorganic encapsulating sub-layer 41 is formed to encapsulate the plurality of light emitting elements 20, the first barrier layer 31, and the second barrier layer 32. Optionally, the first inorganic encapsulating sub-layer 41 is formed to be in contact with the base substrate 10 in an area between the first barrier layer 31 and the second barrier layer 32. The first barrier layer 31 is formed using a material including an up-conversion material configured to convert an incident light into an ultraviolet light.

Figure 6B:
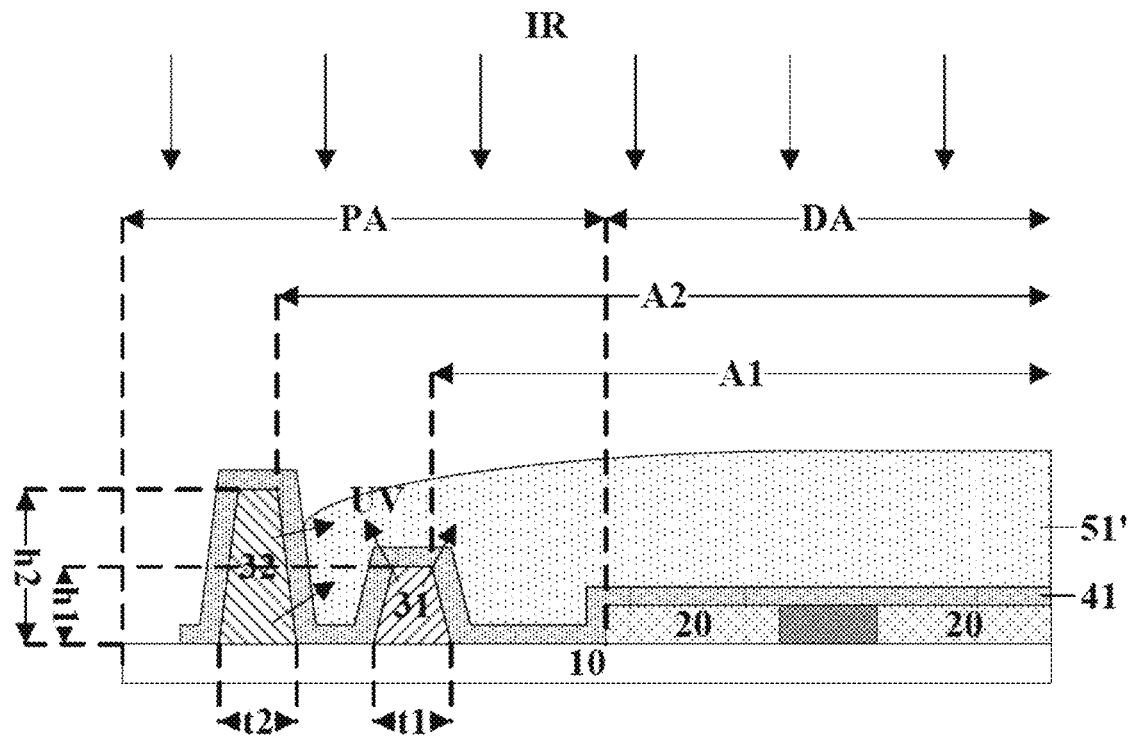

Referring to FIG. 6B, a first organic material layer 51' is formed on a side of the first inorganic encapsulating sub-layer 41 distal to the base substrate 10, and is formed to be substantially enclosed inside the second area A2. Subsequent to forming the first organic material layer 51', the first barrier layer 31 is irradiated by an incident light (e.g., an infrared light IR). Under the irradiation, the first barrier layer 31 converts the incident light into the ultraviolet light UV. A peripheral portion of the first organic material layer 51' is cured by the ultraviolet light UV converted by the first barrier layer 31, thereby stabilizing the peripheral portion of the first organic material layer 51'.

Optionally, the second barrier layer 32 is also formed using a material including the up-conversion material configured to convert the incident light into the ultraviolet light UV. Subsequent to forming the first organic material layer 51', the first barrier layer 31 and the second barrier layer 32 are irradiated by the incident light (e.g., an infrared light IR). The first barrier layer 31 and the second barrier layer 32 convert the incident light into the ultraviolet light UV. A peripheral portion of the first organic material layer 51' is cured by the ultraviolet light UV converted by the first barrier layer 31 and the second barrier layer 32, thereby stabilizing the peripheral portion of the first organic material layer 51'.

In some embodiments, the first organic material layer 51' is formed by ink-jet printing or coating an organic encapsulating material on the base substrate 10. In one example, the first organic material layer 51' is formed by ink-jet printing or coating a mixture including a polymerizable monomer (e.g., >95% v/v), and one or more of a photo-initiator, a reactive diluent, and additional agents. The mixture, when first printed or coated on the base substrate 10, has a certain degree of mobility. To prevent the first organic material layer 51' from climbing over the second barrier layer 32, the peripheral portion of the first organic material layer 51' is cured and stabilized by the ultraviolet light UV converted by the first barrier layer 31 (and optionally, together with the second barrier layer 32). The central portion of the first organic material layer 51', which is not cured by the UV light, retains its mobility, and is allowed to be substantially leveled over time.

Figure 6C:
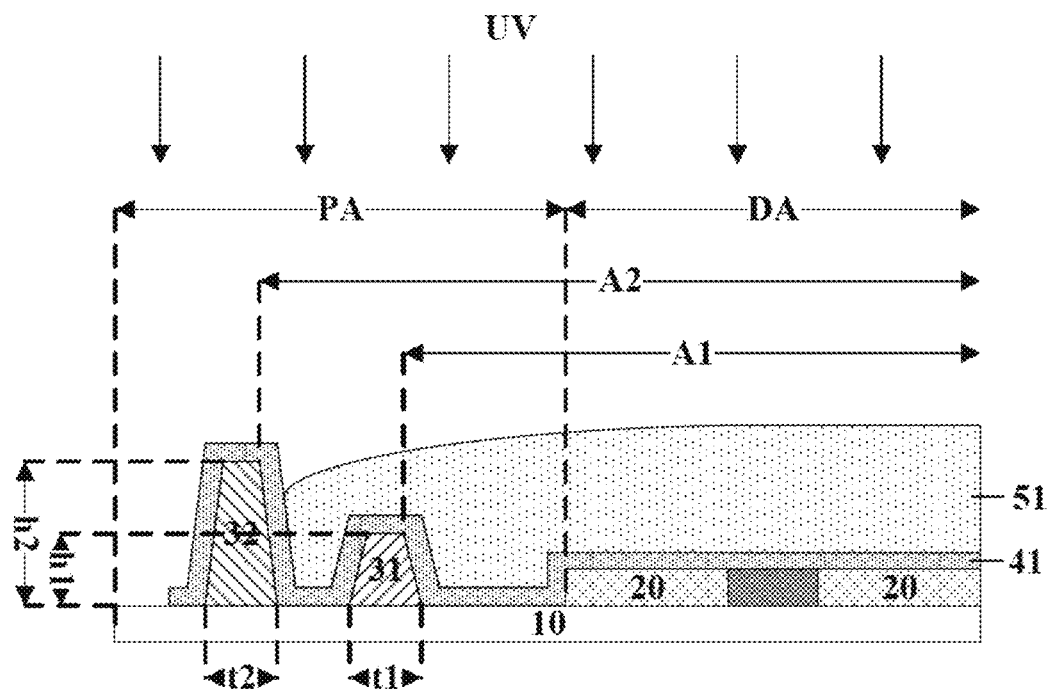

Referring to FIG. 6C, after the first organic material layer 51' has been substantially leveled, e.g., in the central portion of the first organic material layer 51', substantially an entirety of the first organic material layer 51' is then cured, e.g., by an ultraviolet light UV, thereby forming the first organic encapsulating sub-layer 51. Thus, by first curing the peripheral portion of the first organic material layer 51' without curing the central portion, the first organic material layer 51' is allowed to be substantially leveled, and at the same time, is prevented from climbing over the barrier layers (e.g., the second barrier layer 32).

As shown in FIG. 6C, the first organic encapsulating sub-layer 51 is formed on a side of the first inorganic encapsulating sub-layer 41 distal to the base substrate 10. The first organic encapsulating sub-layer 51 is substantially enclosed inside the second area A2. The second barrier layer 32 is formed to have a height h2 relative to the base substrate 10 greater than a height h1 relative to the base substrate 10 of the first barrier layer 31. Optionally, the first barrier layer 31 and the second barrier layer 32 are formed to be spaced apart from each other by a distance in a range of approximately 0.5 mm to approximately 2 mm. Optionally, each of the first barrier layer 31 and the second barrier layer 32 is formed to have a lateral thickness in a range of approximately 10 μm to approximately 20 μm.

Figure 6D:
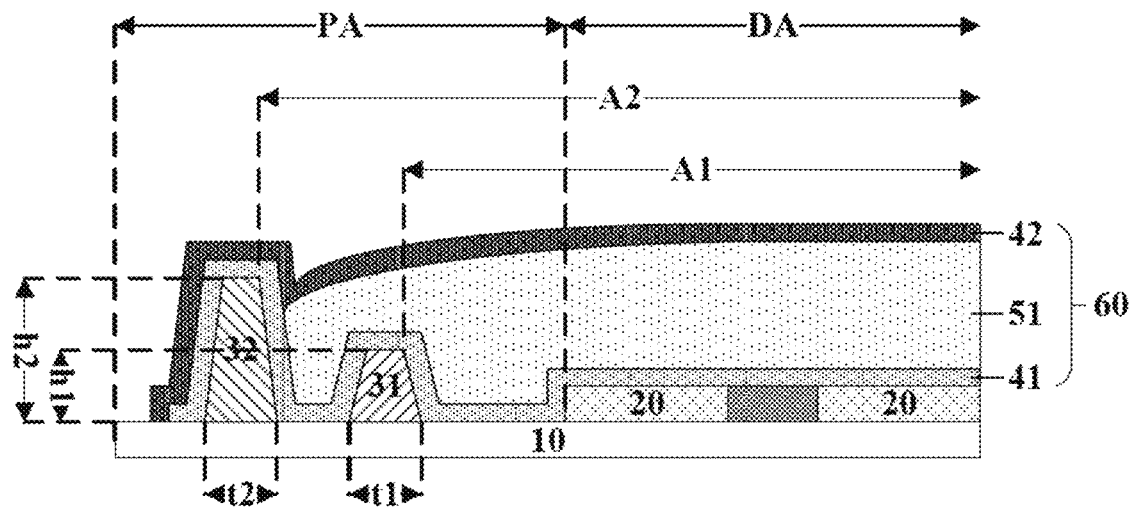

Referring to FIG. 6D, a second inorganic encapsulating sub-layer 42 is formed on a side of the first organic encapsulating sub-layer 51 distal to the base substrate 10, encapsulating the plurality of light emitting elements 20, the first barrier layer 31, the second barrier layer 32, the first inorganic encapsulating sub-layer 41, and the first organic encapsulating sub-layer 51.

Figure 7A:
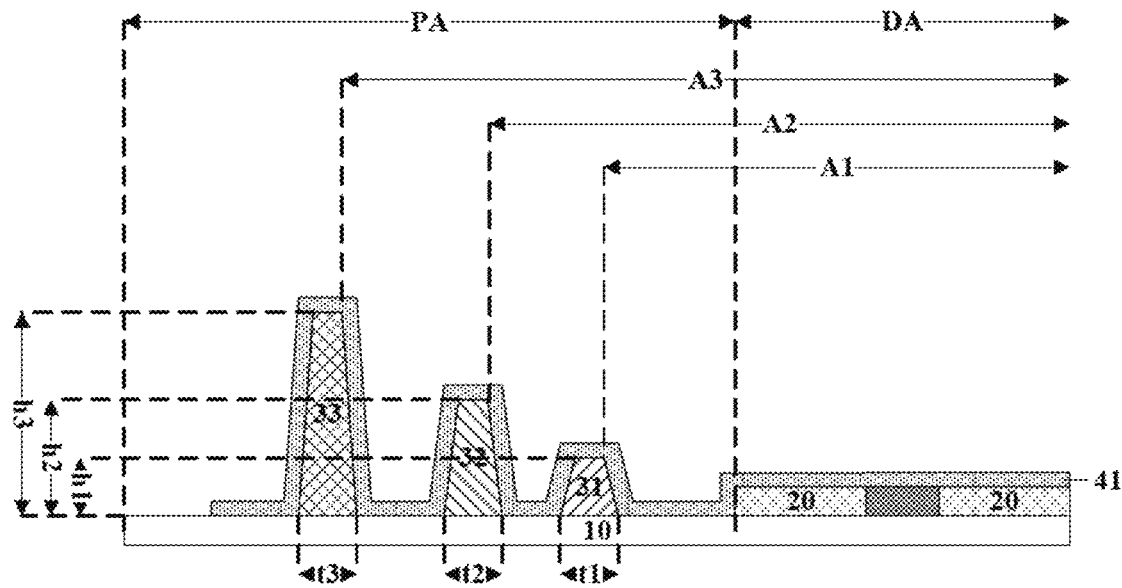
FIGS. 7A to 7G illustrate a process of fabricating a display substrate in some embodiments according to the present disclosure.

FIGS. 7A to 7G illustrate a process of fabricating a display substrate in some embodiments according to the present disclosure. Referring to FIG. 7A, a plurality of light emitting elements 20 are formed on a base substrate 10 and in the display area DA. A first barrier layer 31 is formed on the base substrate 10 and in the peripheral area PA. The first barrier layer 31 forms a first enclosure substantially surrounding a first area A1. A second barrier layer 32 is formed on the base substrate 10 and in the peripheral area PA. The second barrier layer 32 forms a second enclosure substantially surrounding a second area A2, the second area A2 being larger than the first area A1. A third barrier layer 33 is formed on the base substrate 10 and in the peripheral area PA. The third barrier layer 33 forms a third enclosure substantially surrounding a third area A3, the third area A3 being larger than the second area A2. A first inorganic encapsulating sub-layer 41 is formed to encapsulate the plurality of light emitting elements 20, the first barrier layer 31, the second barrier layer 32, and the third barrier layer 33. Optionally, the first inorganic encapsulating sub-layer 41 is formed to be in contact with the base substrate 10 in an area between the first barrier layer 31 and the second barrier layer 32, and in contact with the base substrate 10 in an area between the second barrier layer 32 and the third barrier layer 33. The first barrier layer 31 is formed using a material including an up-conversion material configured to convert an incident light into an ultraviolet light. Optionally, the second barrier layer 32 is formed using a material including an up-conversion material configured to convert an incident light into an ultraviolet light. Optionally, the third barrier layer 33 is formed using a material including an up-conversion material configured to convert an incident light into an ultraviolet light.

Figure 7B:
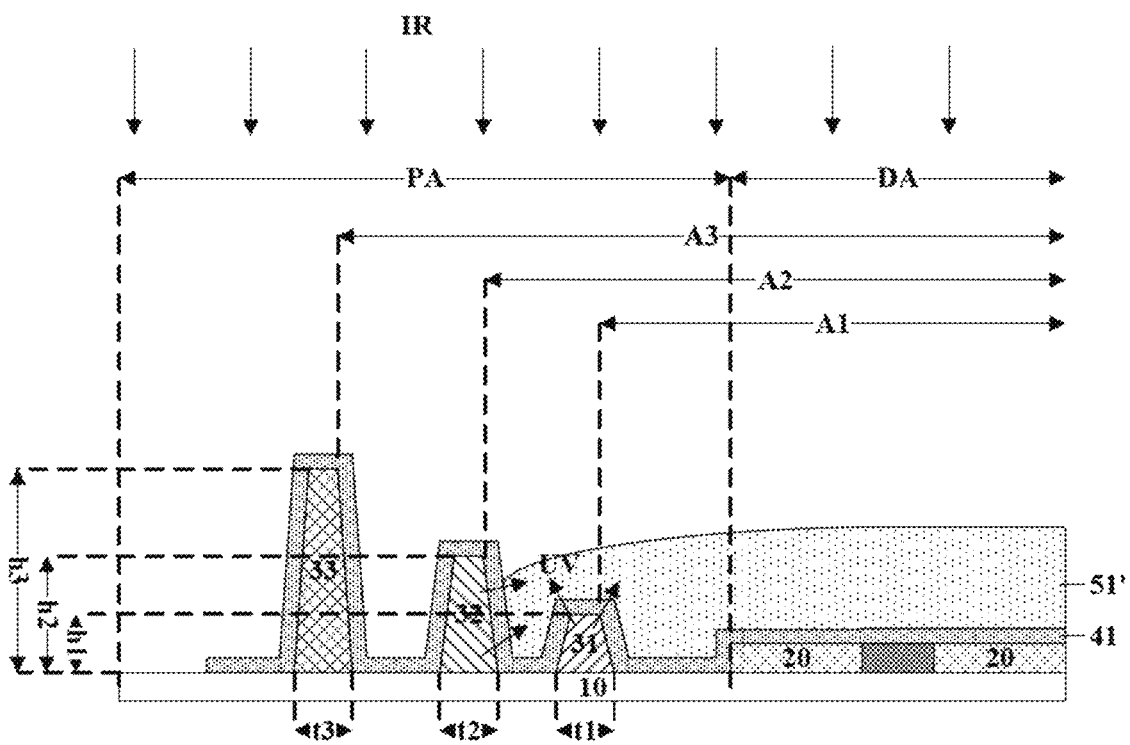

Referring to FIG. 7B, a first organic material layer 51' is formed on a side of the first inorganic encapsulating sub-layer 41 distal to the base substrate 10, and is formed to be substantially enclosed inside the second area A2. Subsequent to forming the first organic material layer 51', the first barrier layer 31 is irradiated by an incident light (e.g., an infrared light IR). Under the irradiation, the first barrier layer 31 converts the incident light into the ultraviolet light UV. A peripheral portion of the first organic material layer 51' is cured by the ultraviolet light UV converted by the first barrier layer 31, thereby stabilizing the peripheral portion of the first organic material layer 51'.

Optionally, the second barrier layer 32 is also formed using a material including the up-conversion material configured to convert the incident light into the ultraviolet light UV. Optionally, subsequent to forming the first organic material layer 51', the first barrier layer 31 and the second barrier layer 32 are irradiated by an incident light (e.g., an infrared light IR), the first barrier layer 31 and the second barrier layer 32 convert the incident light into the ultraviolet light UV. A peripheral portion of the first organic material layer 51' is cured by the ultraviolet light UV converted by the first barrier layer 31 and the second barrier layer 32, thereby stabilizing the peripheral portion of the first organic material layer 51'.

Figure 7C:
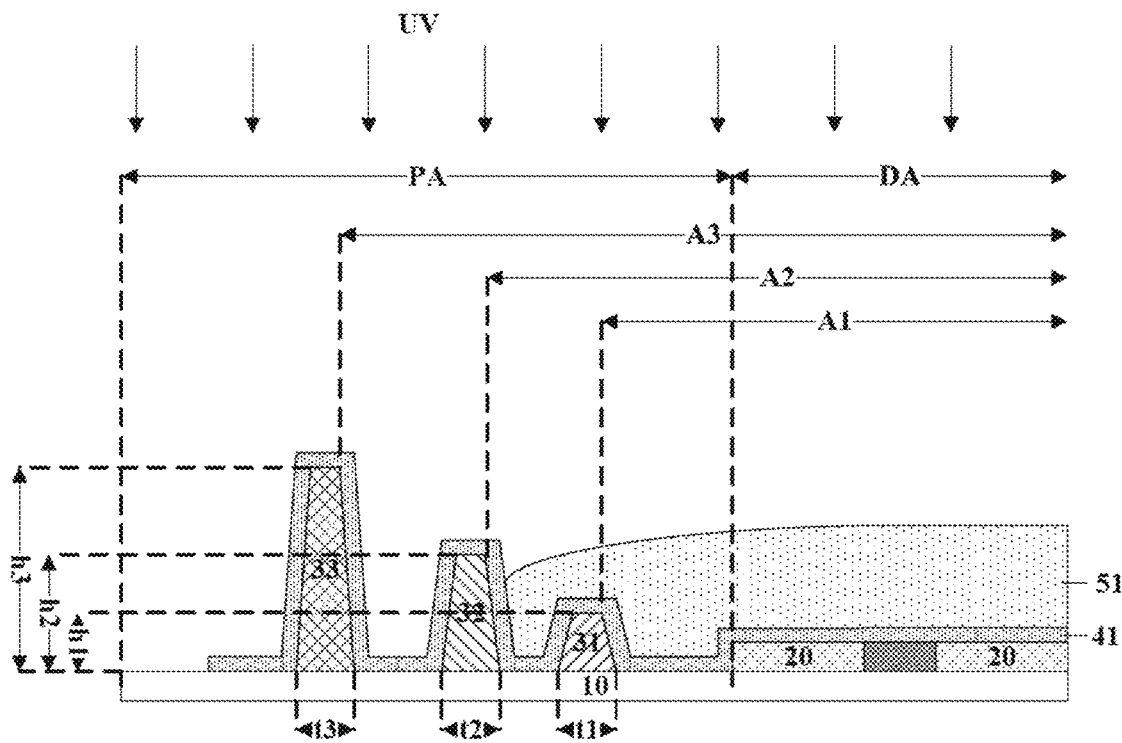

Referring to FIG. 7C, after the first organic material layer 51' has been substantially leveled, e.g., in the central portion of the first organic material layer 51', substantially an entirety of the first organic material layer 51' is then cured, e.g., by an ultraviolet light UV, thereby forming the first organic encapsulating sub-layer 51. The first organic encapsulating sub-layer 51 is formed on a side of the first inorganic encapsulating sub-layer 41 distal to the base substrate 10, and is formed to be substantially enclosed inside the second area A2. The second barrier layer 32 is formed to have a height h2 relative to the base substrate 10 greater than a height h1 relative to the base substrate 10 of the first barrier layer 31. Optionally, the first barrier layer 31 and the second barrier layer 32 are formed to be spaced apart from each other by a distance in a range of approximately 0.5 mm to approximately 2 mm. Optionally, each of the first barrier layer 31 and the second barrier layer 32 is formed to have a lateral thickness in a range of approximately 10 μm to approximately 20 μm.

Figure 7D:
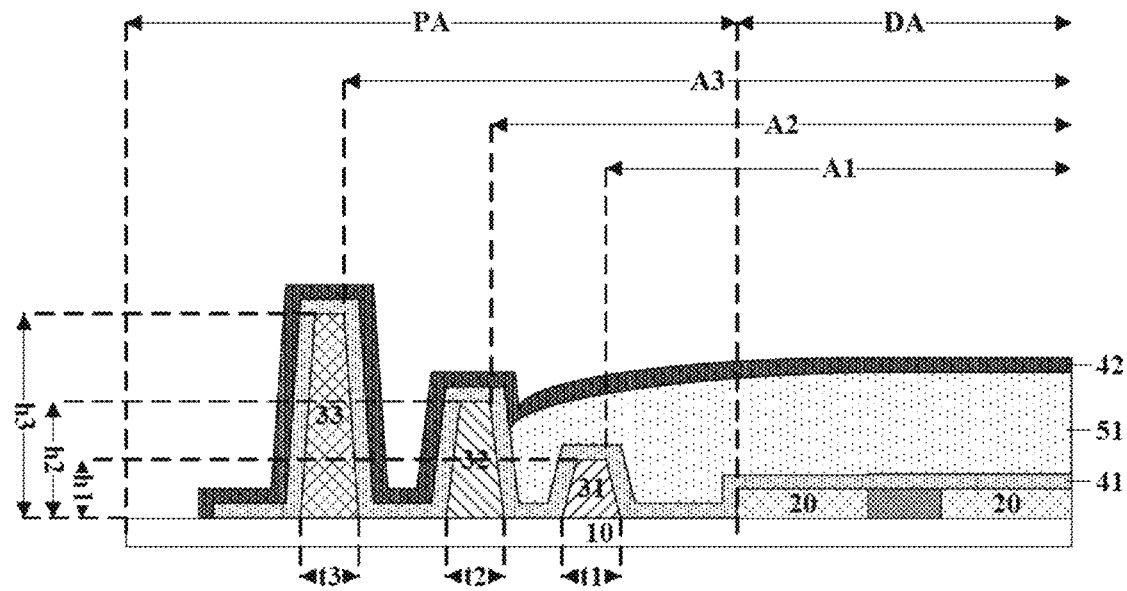

Referring to FIG. 7D, a second inorganic encapsulating sub-layer 42 is formed on a side of the first organic encapsulating sub-layer 51 distal to the base substrate 10, encapsulating the plurality of light emitting elements 20, the first barrier layer 31, the second barrier layer 32, the third barrier layer 33, the first inorganic encapsulating sub-layer 41, and the first organic encapsulating sub-layer 51.

Figure 7E:
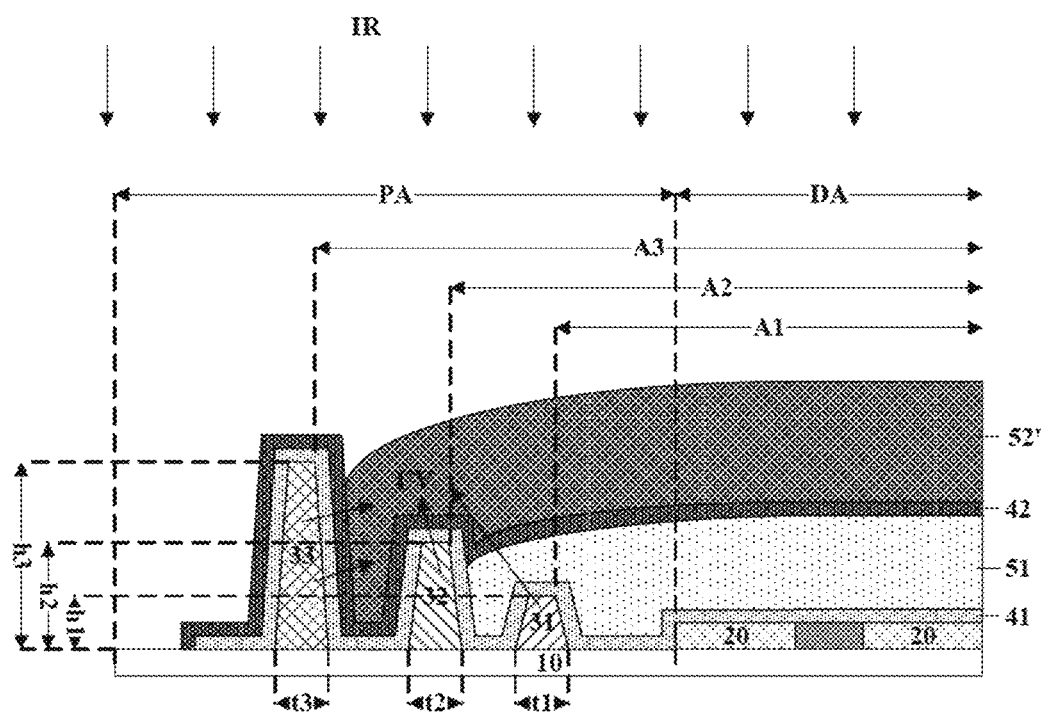

Referring to FIG. 7E, a second organic material layer 52' is formed on a side of the second inorganic encapsulating sub-layer 42 distal to the base substrate 10, and is formed to be substantially enclosed inside the third area A3. Subsequently, the second barrier layer 32 and the third barrier layer 33 are irradiated by an incident light. The second barrier layer 32 and the third barrier layer 33 convert the incident light (e.g., an infrared light IR) into the ultraviolet light UV. A peripheral portion of the second organic material layer 52' is cured by the ultraviolet light UV converted by the second barrier layer 32 and the third barrier layer 33, thereby stabilizing the peripheral portion of the second organic material layer 52'.

Figure 7F:
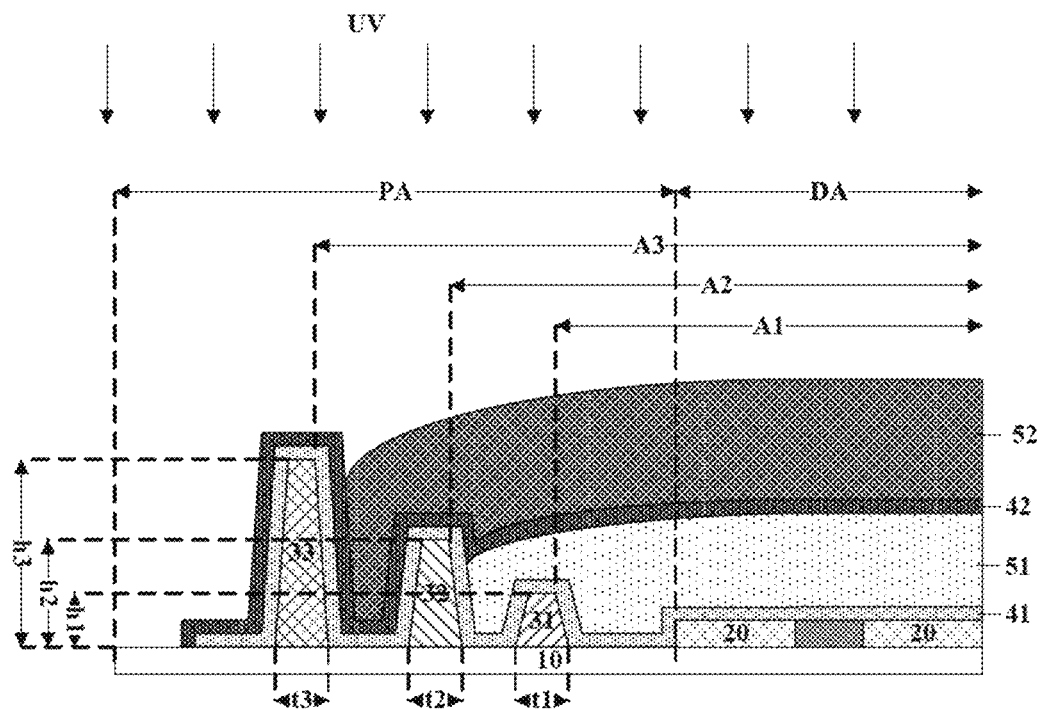

Referring to FIG. 7F, after the second organic material layer 52' has been substantially leveled, e.g., in the central portion of the second organic material layer 52', substantially an entirety of the second organic material layer 52' is then cured, e.g., by an ultraviolet light UV, thereby forming the second organic encapsulating sub-layer 52. By first curing the peripheral portion of the second organic material layer 52' without curing the central portion, the second organic material layer 52' is allowed to be substantially leveled, and at the same time, is prevented from climbing over the barrier layers (e.g., the third barrier layer 33).

Figure 7G:
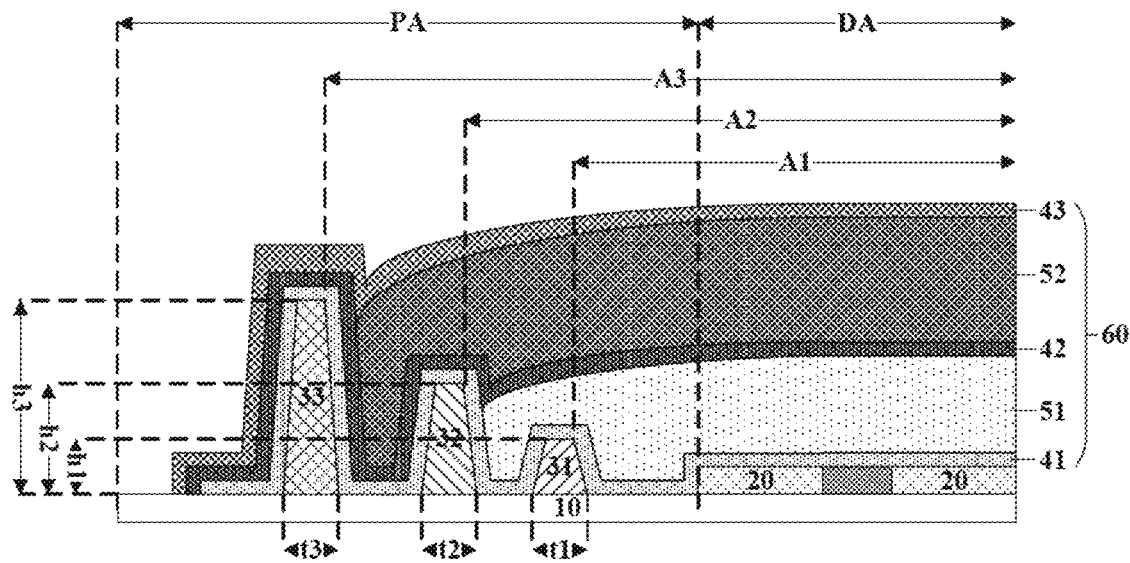

Referring to FIG. 7G, a third inorganic encapsulating sub-layer 43 is formed on a side of the second organic encapsulating sub-layer 52 distal to the base substrate 10, encapsulating the plurality of light emitting elements 20, the first barrier layer 31, the second barrier layer 32, the third barrier layer 33, the first inorganic encapsulating sub-layer 41, the second inorganic encapsulating sub-layer 42, the first organic encapsulating sub-layer 51, and the second organic encapsulating sub-layer 52.

Figure 8A:
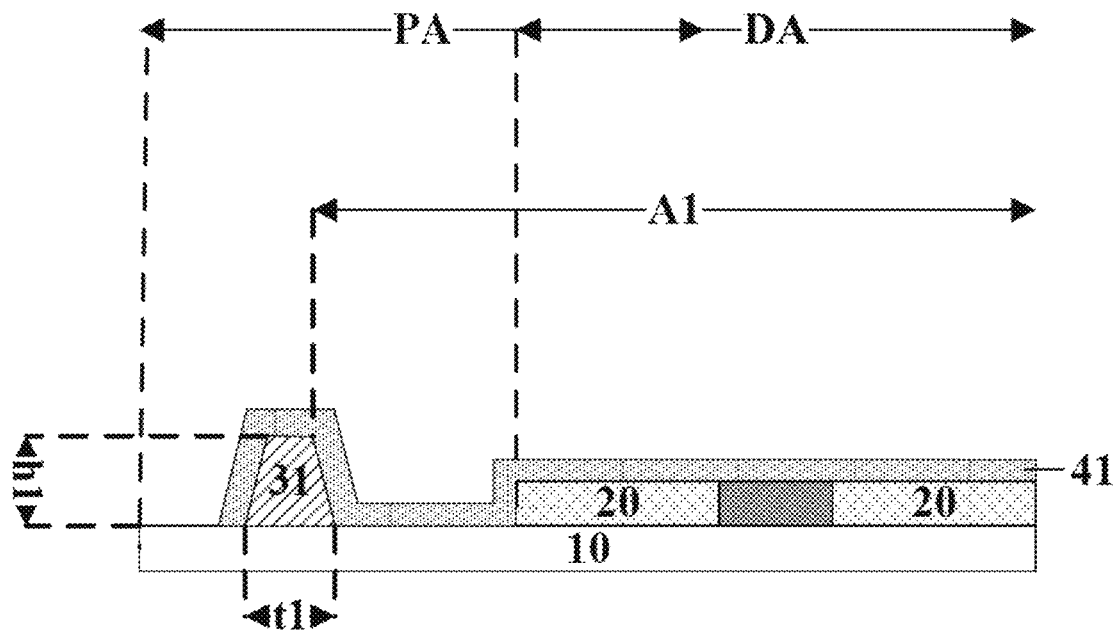
FIGS. 8A to 8D illustrate a process of fabricating a display substrate in some embodiments according to the present disclosure.

FIGS. 8A to 8D illustrate a process of fabricating a display substrate in some embodiments according to the present disclosure. Referring to FIG. 8A, a plurality of light emitting elements 20 are formed on a base substrate 10 and in the display area DA. A first barrier layer 31 is formed on the base substrate 10 and in the peripheral area PA. The first barrier layer 31 forms a first enclosure substantially surrounding a first area A1. A first inorganic encapsulating sub-layer 41 is formed to encapsulate the plurality of light emitting elements 20 and the first barrier layer 31. The first barrier layer 31 is formed using a material including an up-conversion material configured to convert an incident light into an ultraviolet light.

Figure 8B:
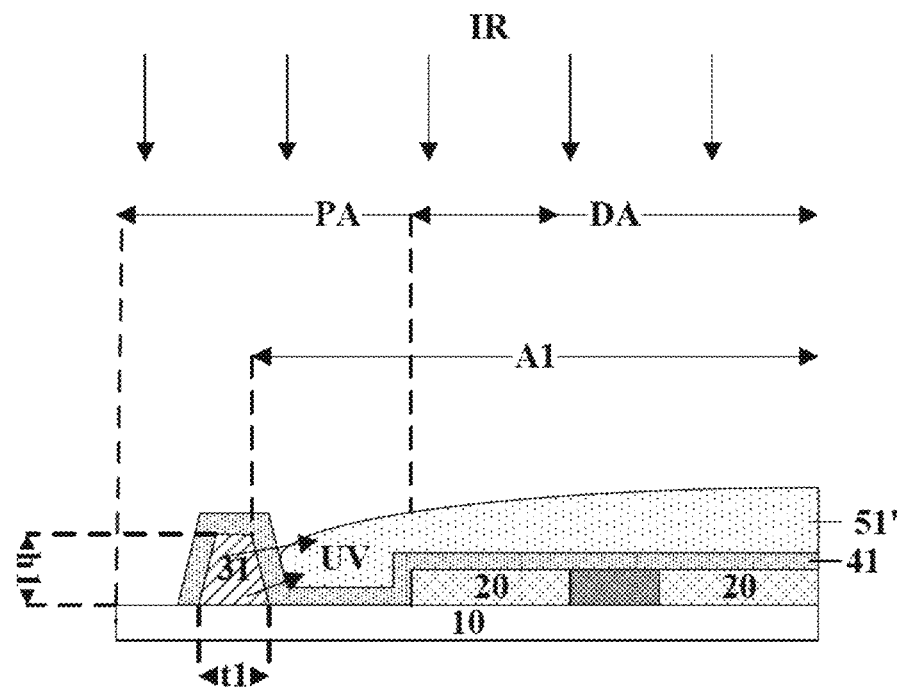

Referring to FIG. 8B, a first organic material layer 51' is formed on a side of the first inorganic encapsulating sub-layer 41 distal to the base substrate 10, and is formed to be substantially enclosed inside the first area A1. Subsequently, the first barrier layer 31 is irradiated by an incident light (e.g., an infrared light IR). The first barrier layer 31 converts the incident light into the ultraviolet light UV. A peripheral portion of the first organic material layer 51' is cured by the ultraviolet light UV converted by the first barrier layer 31, thereby stabilizing the peripheral portion of the first organic material layer 51'.

Figure 8C:
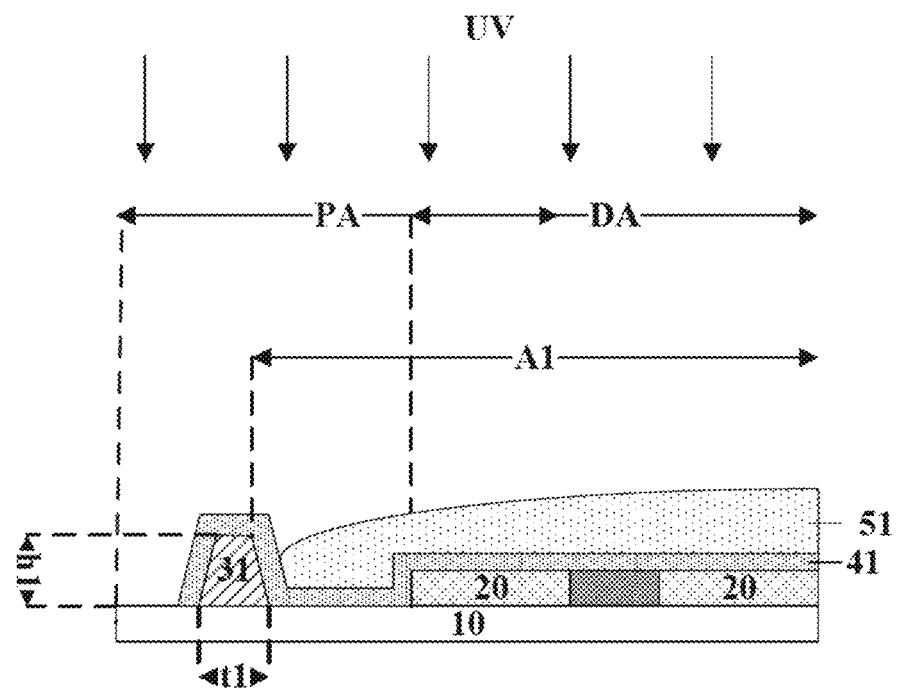

Referring to FIG. 8C, after the first organic material layer 51' has been substantially leveled, e.g., in the central portion of the first organic material layer 51', substantially an entirety of the first organic material layer 51' is then cured, e.g., by an ultraviolet light UV, thereby forming the first organic encapsulating sub-layer 51. As shown in FIG. 8C, the first organic encapsulating sub-layer 51 is formed on a side of the first inorganic encapsulating sub-layer 41 distal to the base substrate 10, and is formed to be substantially enclosed inside the first area A1. Optionally, the first barrier layer 31 is formed to have a lateral thickness in a range of approximately 10 μm to approximately 20 μm.

Figure 8D:
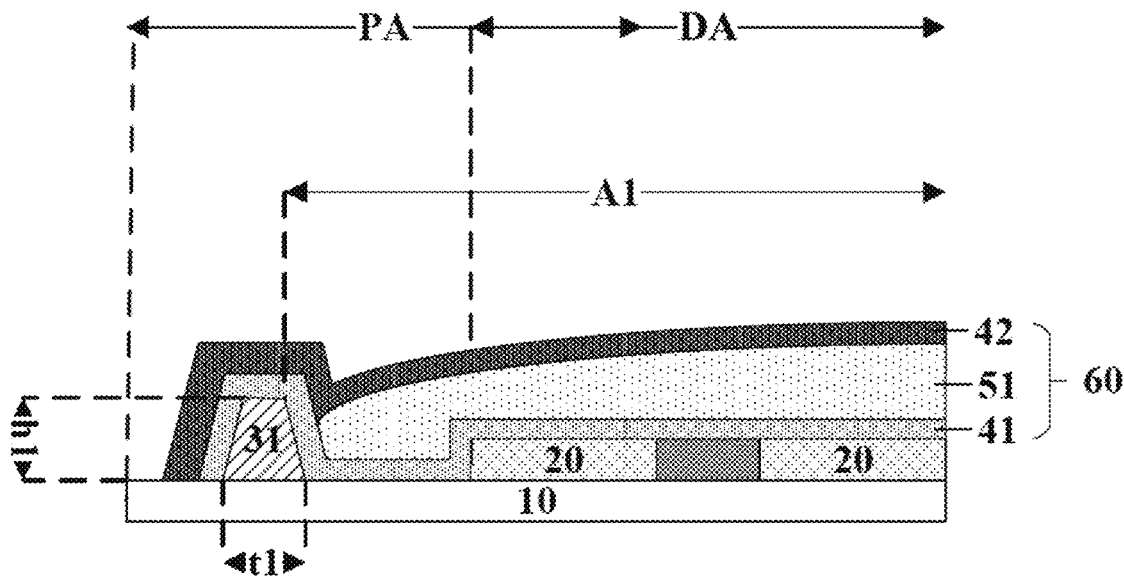

Referring to FIG. 8D, a second inorganic encapsulating sub-layer 42 is formed on a side of the first organic encapsulating sub-layer 51 distal to the base substrate 10, encapsulating the plurality of light emitting elements 20, the first barrier layer 31, the first inorganic encapsulating sub-layer 41, and the first organic encapsulating sub-layer 51.

Figure 9A:
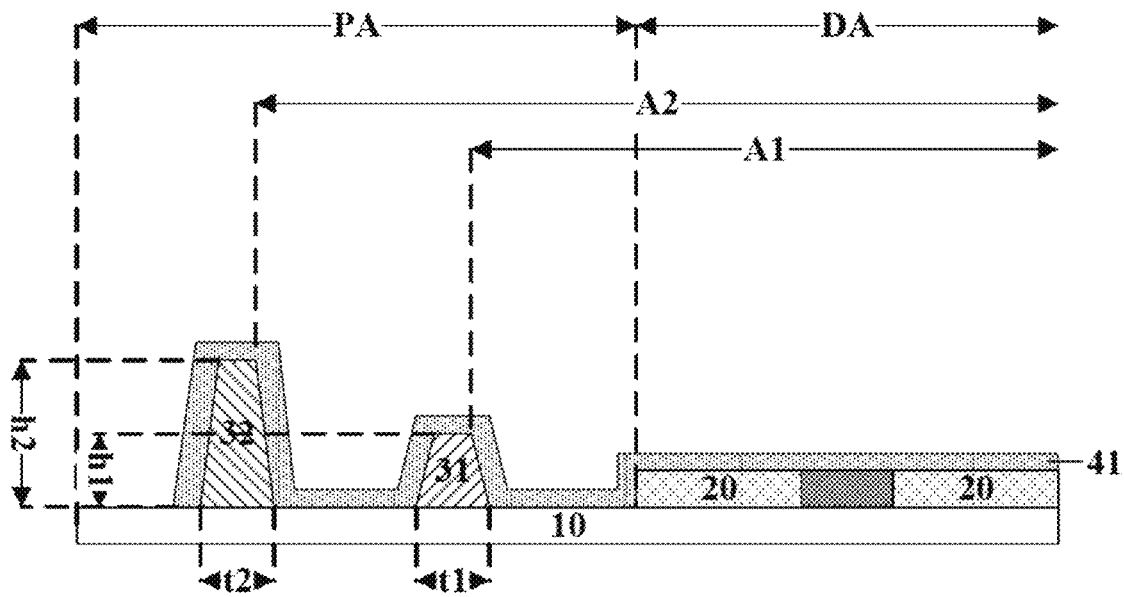
FIGS. 9A to 9G illustrate a process of fabricating a display substrate in some embodiments according to the present disclosure.

FIGS. 9A to 9G illustrate a process of fabricating a display substrate in some embodiments according to the present disclosure. Referring to FIG. 9A, the method includes forming a plurality of light emitting elements 20 on a base substrate 10 and in the display area DA; forming a first barrier layer 31 on the base substrate 10 and in the peripheral area PA, the first barrier layer 31 forming a first enclosure substantially surrounding a first area A1; forming a second barrier layer 32 on the base substrate 10 and in the peripheral area PA, the second barrier layer 32 forming a second enclosure substantially surrounding a second area A2, the second area A2 being larger than the first area A1; and forming a first inorganic encapsulating sub-layer 41 encapsulating the plurality of light emitting elements 20, the first barrier layer 31, and the second barrier layer 32. Optionally, the first inorganic encapsulating sub-layer 41 is formed to be in contact with the base substrate 10 in an area between the first barrier layer 31 and the second barrier layer 32. Both the first barrier layer 31 and the second barrier layer 32 are formed using a material including an up-conversion material configured to convert an incident light into an ultraviolet light.

Figure 9B:
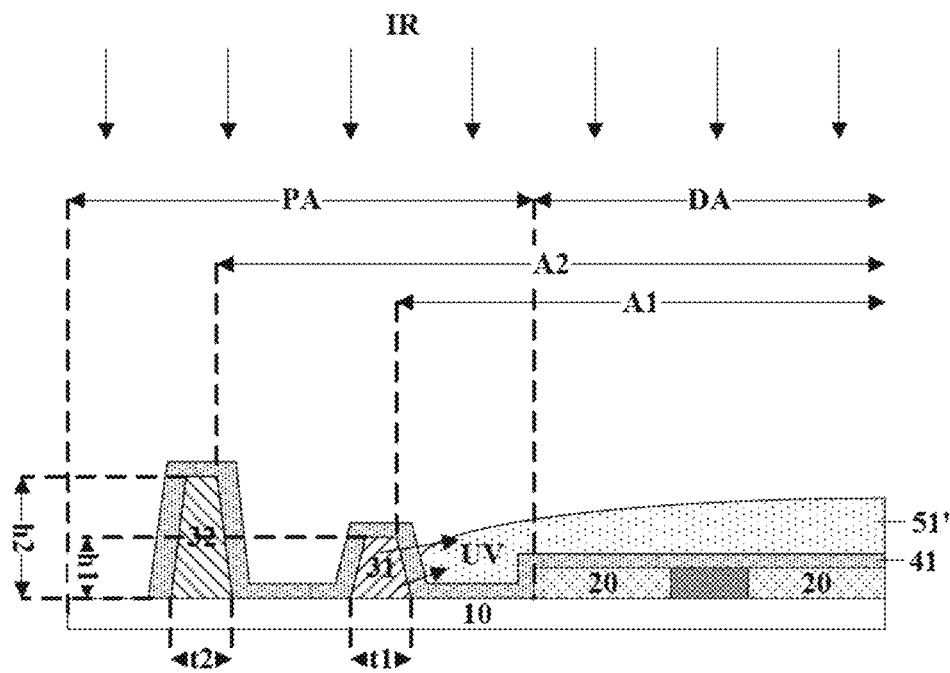
Figure 9C:
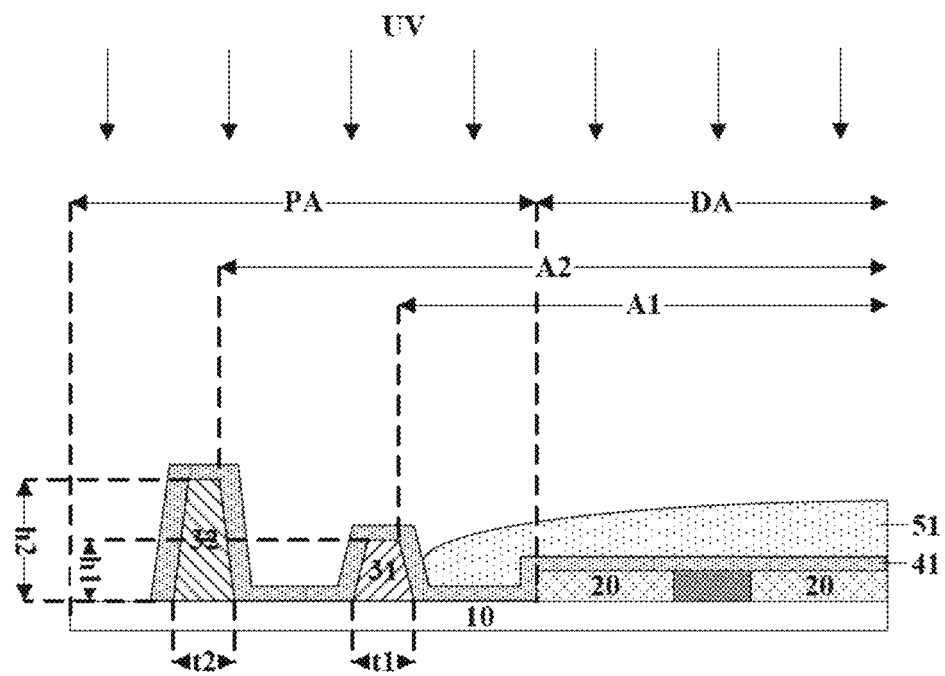

FIG. 9B and FIG. 9C describe processes similar to those depicted in FIG. 8B and FIG. 8C for forming a first organic encapsulating sub-layer 51. Referring to FIG. 9B and FIG. 9C, the second barrier layer 32 is formed to have a height h2 relative to the base substrate 10 greater than a height h1 relative to the base substrate 10 of the first barrier layer 31. Optionally, the first barrier layer 31 and the second barrier layer 32 are formed to be spaced apart from each other by a distance in a range of approximately 0.5 mm to approximately 2 mm. Optionally, each of the first barrier layer 31 and the second barrier layer 32 is formed to have a lateral thickness in a range of approximately 10 μm to approximately 20 μm.

Figure 9D:
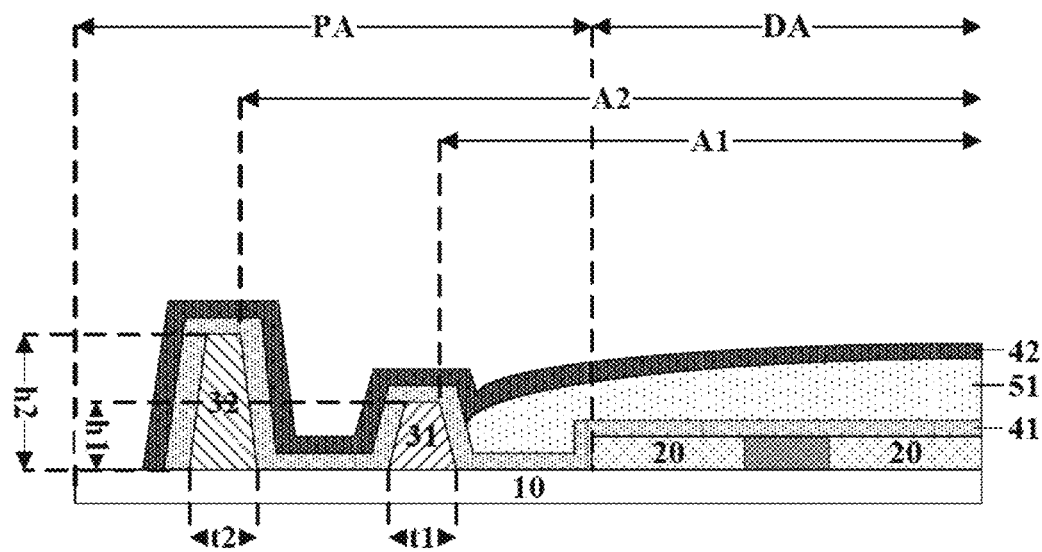

Referring to FIG. 9D, a second inorganic encapsulating sub-layer 42 is formed on a side of the first organic encapsulating sub-layer 51 distal to the base substrate 10, encapsulating the plurality of light emitting elements 20, the first barrier layer 31, the second barrier layer 32, the first inorganic encapsulating sub-layer 41, and the first organic encapsulating sub-layer 51.

Figure 9E:
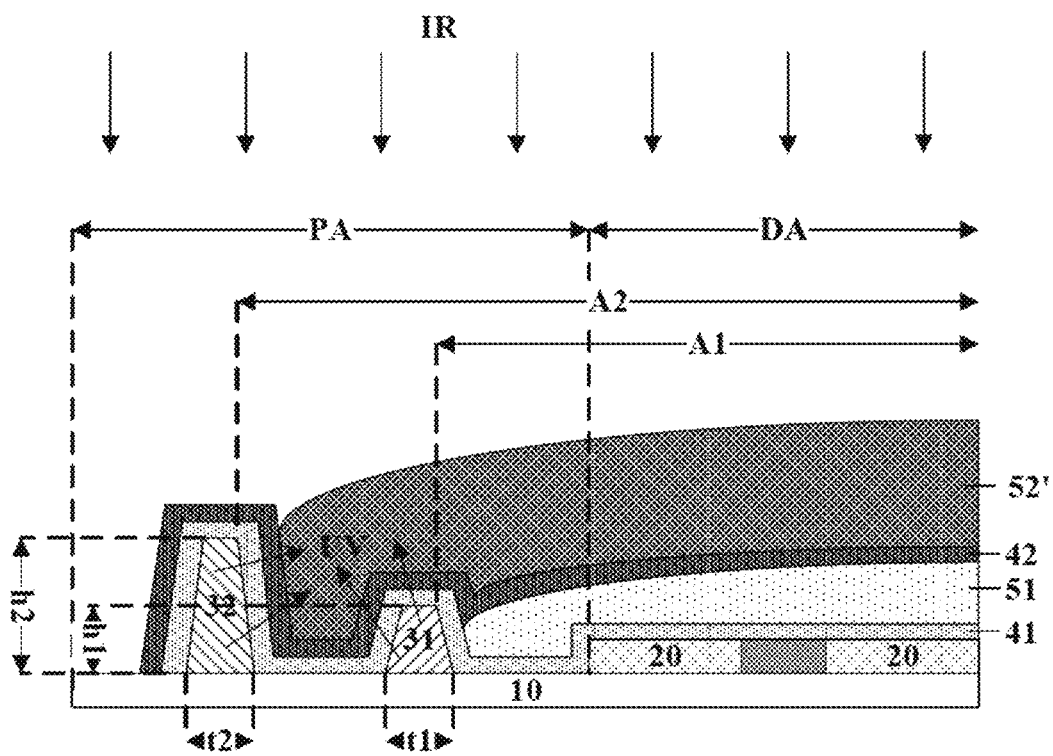

Referring to FIG. 9E, a second organic material layer 52' is formed on a side of the second inorganic encapsulating sub-layer 42 distal to the base substrate 10, and is formed to be substantially enclosed inside the second area A2. Subsequent to forming the second organic material layer 52', the first barrier layer 31 and the second barrier layer 32 are irradiated by the incident light. The first barrier layer 31 (and optionally, together with the second barrier layer 32) converts the incident light (e.g., an infrared light IR) into the ultraviolet light UV. A peripheral portion of the second organic material layer 52' is cured by the ultraviolet light UV converted by the first barrier layer 31 (and optionally the second barrier layer 32), thereby stabilizing the peripheral portion of the second organic material layer 52'.

Figure 9F:
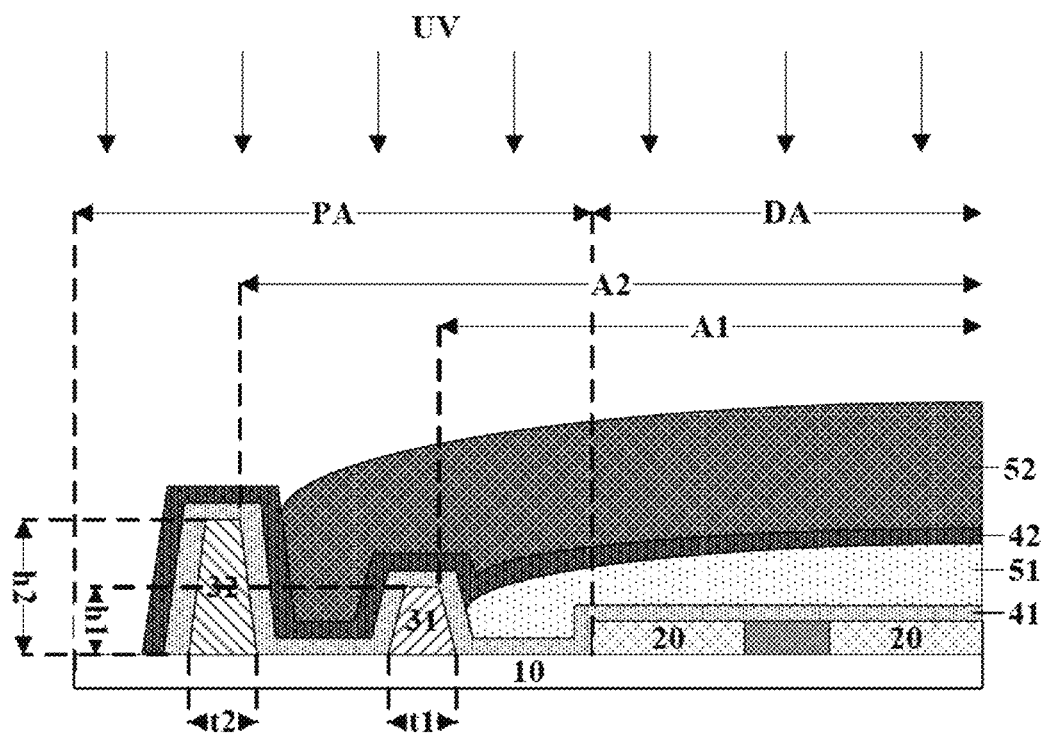

Referring to FIG. 9F, after the second organic material layer 52' has been substantially leveled, e.g., in the central portion of the second organic material layer 52', substantially an entirety of the second organic material layer 52' is cured, e.g., by an ultraviolet light UV, thereby forming the second organic encapsulating sub-layer 52.

Figure 9G:
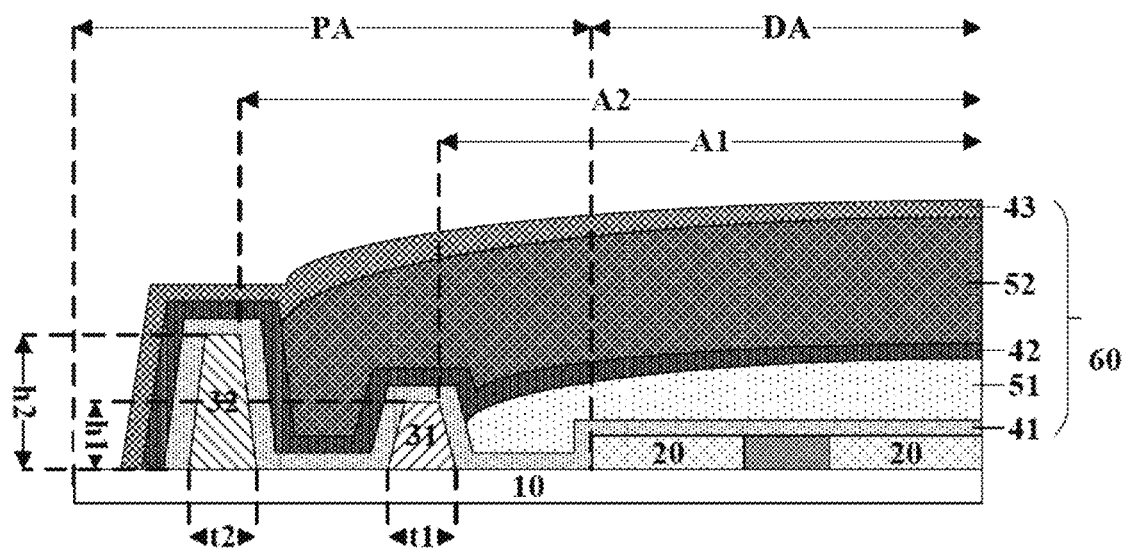

Referring to FIG. 9G, a third inorganic encapsulating sub-layer 43 is formed on a side of the second organic encapsulating sub-layer 52 distal to the base substrate 10, encapsulating the plurality of light emitting elements 20, the first barrier layer 31, the second barrier layer 32, the first inorganic encapsulating sub-layer 41, the second inorganic encapsulating sub-layer 42, the first organic encapsulating sub-layer 51, and the second organic encapsulating sub-layer 52.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a display area and a peripheral area, comprising:
   a base substrate;
   a plurality of light emitting elements on the base substrate and in the display area;
   an encapsulating layer on a side of the plurality of light emitting elements distal to the base substrate to encapsulate the plurality of light emitting elements; and
   a first barrier layer on the base substrate and in the peripheral area and forming a first enclosure substantially surrounding a first area: wherein the first barrier layer comprises an up-conversion material configured to convert an incident light into an ultraviolet light; and wherein the encapsulating layer comprises:
- a first organic encapsulating sub-layer on the base substrate; and
- a first inorganic encapsulating sub-layer encapsulating the plurality of light emitting elements and the first barrier layer.

2. The display substrate of claim 1, wherein the first organic encapsulating sub-layer is substantially enclosed inside the first area and is on a side of the first inorganic encapsulating sub-layer distal to the base substrate.

3. The display substrate of claim 1, further comprising a second barrier layer on the base substrate and in the peripheral area and forming a second enclosure substantially surrounding a second area, the second area being larger than the first area;
- wherein the first inorganic encapsulating sub-layer encapsulates the plurality of light emitting elements, the first barrier layer, and the second barrier layer; and
- the first inorganic encapsulating sub-layer is in contact with the base substrate in an area between the first barrier layer and the second barrier layer.

4. The display substrate of claim 3, wherein the first organic encapsulating sub-layer is substantially enclosed inside the second area.

5. The display substrate of claim 3, wherein the second barrier layer comprises the up-conversion material configured to convert the incident light into the ultraviolet light.

6. The display substrate of claim 4, wherein the encapsulating layer further comprises a second inorganic encapsulating sub-layer on a side of the first organic encapsulating sub-layer distal to the base substrate, encapsulating the plurality of light emitting elements, the first barrier layer, the second barrier layer, the first inorganic encapsulating sub-layer, and the first organic encapsulating sub-layer.

7. The display substrate of claim 6, wherein the encapsulating layer further comprises a second organic encapsulating sub-layer on a side of the second inorganic encapsulating sub-layer distal to the base substrate, and substantially enclosed inside the second area.

8. The display substrate of claim 6, further comprising a third barrier layer on the base substrate and in the peripheral area and forming a third enclosure substantially surrounding a third area, the third area being larger than the second area;
- wherein the first inorganic encapsulating sub-layer is on a side of the first barrier layer, the second barrier layer, and the third barrier layer distal to the base substrate, encapsulating the plurality of light emitting elements, the first barrier layer, the second barrier layer, and the third barrier layer;
- the first inorganic encapsulating sub-layer is in contact with the base substrate in an area between the second barrier layer and the third barrier layer; and
- the second inorganic encapsulating sub-layer is on a side of the first inorganic encapsulating sub-layer and the first organic encapsulating sub-layer distal to the base substrate, encapsulating the plurality of light emitting elements, the first barrier layer, the second barrier layer, the third barrier layer, the first inorganic encapsulating sub-layer, and the first organic encapsulating sub-layer.

9. The display substrate of claim 8, wherein the encapsulating layer further comprises a second organic encapsulating sub-layer on a side of the second inorganic encapsulating sub-layer distal to the base substrate, and substantially enclosed inside the third area.

10. The display substrate of claim 8, wherein the third barrier layer comprises the up-conversion material configured to convert the incident light into the ultraviolet light.

11. A display apparatus, comprising the display substrate of claim 1.

12. A method of fabricating a display substrate having a display area and a peripheral area, comprising:
- forming a plurality of light emitting elements on a base substrate and in the display area;
- forming an encapsulating layer on a side of the plurality of light emitting elements distal to the base substrate to encapsulate the plurality of light emitting elements; and
- forming a first barrier layer on the base substrate and in the peripheral area, the first barrier layer forming a first enclosure substantially surrounding a first area;
- wherein the first barrier layer is formed using a material comprising an up-conversion material configured to convert an incident light into an ultraviolet light; and
- wherein forming the encapsulating layer comprises:
  - forming a first organic encapsulating sub-layer on the base substrate; and
  - forming a first inorganic encapsulating sub-layer encapsulating the plurality of light emitting elements and the first barrier layer.

13. The method of claim 12, wherein forming the first organic encapsulating sub-layer comprises:
- forming a first organic material layer substantially enclosed inside the first area;
- subsequent to forming the first organic material layer, irradiating the first barrier layer by the incident light, the first barrier layer converting the incident light into the ultraviolet light; and
- curing a peripheral portion of the first organic material layer by the ultraviolet light converted by the first barrier layer, thereby stabilizing the peripheral portion of the first organic material layer.

14. The method of claim 12, wherein the first organic encapsulating sub-layer is formed on a side of the first inorganic encapsulating sub-layer distal to the base substrate.

15. The method of claim 14, further comprising forming a second barrier layer on the base substrate and in the peripheral area, the second barrier layer forming a second enclosure substantially surrounding a second area, the second area being larger than the first area;
- wherein the first inorganic encapsulating sub-layer is formed to encapsulate the plurality of light emitting elements, the first barrier layer, and the second barrier layer; and
- the first inorganic encapsulating sub-layer is formed to be in contact with the base substrate in an area between the first barrier layer and the second barrier layer.

16. The method of claim 15, wherein the first organic encapsulating sub-layer is formed to be substantially enclosed inside the second area;
- wherein forming the first organic encapsulating sub-layer comprises:
  - forming a first organic material layer substantially enclosed inside the second area;
  - subsequent to forming the first organic material layer, irradiating the first barrier layer by the incident light, the first barrier layer converting the incident light into the ultraviolet light; and
  - curing a peripheral portion of the first organic material layer by the ultraviolet light converted by the first barrier layer, thereby stabilizing the peripheral portion of the first organic material layer.

17. The method of claim 15, wherein the second barrier layer is formed using a material comprising the up-conversion material configured to convert the incident light into the ultraviolet light; and wherein forming the encapsulating layer further comprises forming a first organic encapsulating sub-layer on a side of the first inorganic encapsulating sub-layer distal to the base substrate, and substantially enclosed inside the second area;

wherein forming the first organic encapsulating sub-layer comprises:

forming a first organic material layer substantially enclosed inside the second area;

subsequent to forming the first organic material layer, irradiating the first barrier layer and the second barrier layer by the incident light, the first barrier layer and the second barrier layer converting the incident light into the ultraviolet light; and curing a peripheral portion of the first organic material layer by the ultraviolet light converted by the first barrier layer and the second barrier layer, thereby stabilizing the peripheral portion of the first organic material layer.

18. The method of claim 17, wherein forming the encapsulating layer further comprises forming a second inorganic encapsulating sub-layer on a side of the first organic encapsulating sub-layer distal to the base substrate, encapsulating the plurality of light emitting elements, the first barrier layer, the second barrier layer, the first inorganic encapsulating sub-layer, and the first organic encapsulating sub-layer.

19. The method of claim 18, wherein forming the encapsulating layer further comprises forming a second organic encapsulating sub-layer on a side of the second inorganic encapsulating sub-layer distal to the base substrate, and the second organic encapsulating sub-layer is formed to be substantially enclosed inside the second area.

20. The method of claim 18, further comprising forming a third barrier layer on the base substrate and in the peripheral area, the third barrier layer forming a third enclosure substantially surrounding a third area, the third area being larger than the second area;

wherein the first inorganic encapsulating sub-layer is formed on a side of the first barrier layer, the second barrier layer, and the third barrier layer distal to the base substrate, encapsulating the plurality of light emitting elements, the first barrier layer, the second barrier layer, and the third barrier layer;

the first inorganic encapsulating sub-layer is formed to be in contact with the base substrate in an area between the second barrier layer and the third barrier layer; and the second inorganic encapsulating sub-layer is formed on a side of the first inorganic encapsulating sub-layer and the first organic encapsulating sub-layer distal to the base substrate, encapsulating the plurality of light emitting elements, the first barrier layer, the second barrier layer, the third barrier layer, the first inorganic encapsulating sub-layer, and the first organic encapsulating sub-layer.

\* \* \* \* \*